(12) United States Patent
Takeuchi et al.

(10) Patent No.: US 12,417,912 B2
(45) Date of Patent: Sep. 16, 2025

(54) RADIO FREQUENCY (RF) SEMICONDUCTOR DEVICES INCLUDING A GROUND PLANE LAYER HAVING A SUPERLATTICE

(71) Applicant: ATOMERA INCORPORATED, Los Gatos, CA (US)

(72) Inventors: Hideki Takeuchi, San Jose, CA (US); Robert J. Mears, Wellesley, MA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 18/669,156

(22) Filed: May 20, 2024

(65) Prior Publication Data
US 2024/0321575 A1    Sep. 26, 2024

Related U.S. Application Data

(63) Continuation of application No. 17/653,305, filed on Mar. 3, 2022, now Pat. No. 12,020,926.
(Continued)

(51) Int. Cl.
*H01L 21/02* (2006.01)
*H10D 30/60* (2025.01)
(Continued)

(52) U.S. Cl.
CPC .... *H01L 21/02507* (2013.01); *H01L 21/0245* (2013.01); *H10D 30/601* (2025.01); *H10D 30/751* (2025.01); *H10D 62/8164* (2025.01)

(58) Field of Classification Search
CPC ........... H01L 21/02507; H01L 21/0245; H01L 29/1054; H01L 29/155; H01L 29/7833;
(Continued)

(56) References Cited

U.S. PATENT DOCUMENTS 4,937,204 A    6/1990    Ishibashi et al.
5,216,262 A    6/1993    Tsu
(Continued)

FOREIGN PATENT DOCUMENTS

GB    2347520    6/2000

OTHER PUBLICATIONS

U.S. Appl. No. 17/653,305, filed Apr. 21, 2021, Hytha et al. See Priority U.S. Appl. No. 17/653,305, filed Mar. 3, 2022.
(Continued)

*Primary Examiner* — Ajay Ojha
*Assistant Examiner* — Sandra Milena Rodriguez Villanu
(74) *Attorney, Agent, or Firm* — ALLEN, DYER, DOPPELT, + GILCHRIST, P.A.

(57) ABSTRACT

A radio frequency (RF) semiconductor device may include a semiconductor-on-insulator substrate, and an RF ground plane layer on the semiconductor-on-insulator substrate including a conductive superlattice. The conductive superlattice may include stacked groups of layers, with each group of layers comprising stacked doped base semiconductor monolayers defining a doped base semiconductor portion, and at least one non-semiconductor monolayer constrained within a crystal lattice of adjacent doped base semiconductor portions. The RF semiconductor device may further include a body above the RF ground plane layer, spaced apart source and drain regions adjacent the body and defining a channel region in the body, and a gate overlying the channel region.

23 Claims, 20 Drawing Sheets

Related U.S. Application Data

(60) Provisional application No. 63/159,714, filed on Mar. 11, 2021, provisional application No. 63/156,052, filed on Mar. 3, 2021.

(51) Int. Cl.
  *H10D 30/69* (2025.01)
  *H10D 62/815* (2025.01)

(58) Field of Classification Search
  CPC ......... H01L 29/66772; H01L 29/78603; H01L 29/78606; H01L 29/78654; H01L 29/152
  See application file for complete search history.

(56) References Cited

U.S. PATENT DOCUMENTS

| | | |
|---|---|---|
| 5,357,119 A | 10/1994 | Wang et al. |
| 5,683,934 A | 11/1997 | Candelaria |
| 5,796,119 A | 8/1998 | Seabaugh |
| 6,141,361 A | 10/2000 | Mears et al. |
| 6,376,337 B1 | 4/2002 | Wang et al. |
| 6,472,685 B2 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,067,856 B2 | 6/2006 | Ramdani et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dulovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 10,355,151 B2 | 7/2019 | Chen et al. |
| 10,361,243 B2 | 7/2019 | Mears et al. |
| 10,367,028 B2 | 7/2019 | Chen et al. |
| 10,367,064 B2 | 7/2019 | Rao |
| 10,381,242 B2 | 8/2019 | Takeuchi |
| 10,396,223 B2 | 8/2019 | Chen et al. |
| 10,410,880 B2 | 9/2019 | Takeuchi |
| 10,453,945 B2 | 10/2019 | Mears et al. |
| 10,461,118 B2 | 10/2019 | Chen et al. |
| 10,468,245 B2 | 11/2019 | Weeks et al. |
| 10,529,757 B2 | 1/2020 | Chen et al. |
| 10,529,768 B2 | 1/2020 | Chen et al. |
| 10,566,191 B1 | 2/2020 | Weeks et al. |
| 10,580,866 B1 | 3/2020 | Takeuchi et al. |
| 10,580,867 B1 | 3/2020 | Takeuchi et al. |
| 10,593,761 B1 | 3/2020 | Takeuchi et al. |
| 10,608,027 B2 | 3/2020 | Chen et al. |
| 10,608,043 B2 | 3/2020 | Chen et al. |
| 10,615,209 B2 | 4/2020 | Chen et al. |
| 10,636,879 B2 | 4/2020 | Rao |
| 10,727,049 B2 | 7/2020 | Weeks et al. |
| 10,741,436 B2 | 8/2020 | Stephenson et al. |
| 10,763,370 B2 | 9/2020 | Stephenson |
| 10,777,451 B2 | 9/2020 | Stephenson et al. |
| 10,811,498 B2 | 10/2020 | Weeks et al. |
| 10,818,755 B2 | 10/2020 | Takeuchi et al. |
| 10,825,901 B1 | 11/2020 | Burton et al. |
| 10,825,902 B1 | 11/2020 | Burton et al. |
| 10,840,335 B2 | 11/2020 | Takeuchi et al. |
| 10,840,336 B2 | 11/2020 | Connelly et al. |
| 10,840,337 B2 | 11/2020 | Takeuchi et al. |
| 10,840,388 B1 | 11/2020 | Burton et al. |
| 10,847,618 B2 | 11/2020 | Takeuchi et al. |
| 10,854,717 B2 | 12/2020 | Takeuchi et al. |
| 10,868,120 B1 | 12/2020 | Burton et al. |
| 10,879,356 B2 | 12/2020 | Stephenson et al. |
| 10,879,357 B1 | 12/2020 | Burton et al. |
| 10,884,185 B2 | 1/2021 | Stephenson |
| 10,937,868 B2 | 3/2021 | Burton et al. |
| 10,937,888 B2 | 3/2021 | Burton et al. |
| 11,075,078 B1 | 7/2021 | Cody et al. |
| 11,094,818 B2 | 8/2021 | Takeuchi et al. |
| 11,177,351 B2 | 11/2021 | Weeks et al. |
| 11,183,565 B2 | 11/2021 | Burton et al. |
| 11,384,789 B2 | 7/2022 | Rey et al. |
| 11,742,202 B2 | 8/2023 | Takeuchi et al. |
| 2003/0034529 A1 | 2/2003 | Fitzgerald et al. |
| 2003/0057416 A1 | 3/2003 | Currie et al. |
| 2005/0282330 A1 | 12/2005 | Mears et al. |
| 2006/0220118 A1 | 10/2006 | Stephenson et al. |
| 2006/0267130 A1 | 11/2006 | Rao |
| 2007/0012910 A1 | 1/2007 | Mears et al. |
| 2007/0020833 A1 | 1/2007 | Mears et al. |
| 2008/0012004 A1 | 1/2008 | Huang et al. |
| 2008/0258134 A1 | 10/2008 | Mears et al. |
| 2009/0108350 A1* | 4/2009 | Cai ............ H01L 29/7848 257/E29.295 |
| 2011/0215299 A1 | 9/2011 | Rao |
| 2015/0357414 A1 | 12/2015 | Mears |
| 2016/0149023 A1 | 5/2016 | Mears et al. |

(56) References Cited

U.S. PATENT DOCUMENTS

| | | | |
|---|---|---|---|
| 2016/0233333 A1* | 8/2016 | Toh | H10N 50/01 |
| 2016/0336407 A1* | 11/2016 | Mears | H01L 29/0638 |
| 2016/0358773 A1 | 12/2016 | Mears et al. | |
| 2017/0178950 A1 | 6/2017 | Batude et al. | |
| 2019/0058059 A1 | 2/2019 | Stephenson et al. | |
| 2019/0189652 A1 | 6/2019 | Chen et al. | |
| 2019/0189658 A1 | 6/2019 | Chen et al. | |
| 2019/0319135 A1 | 10/2019 | Stephenson | |
| 2019/0319167 A1 | 10/2019 | Stephenson | |
| 2020/0135489 A1 | 4/2020 | Weeks et al. | |
| 2020/0161427 A1 | 5/2020 | Takeuchi et al. | |
| 2020/0321467 A1* | 10/2020 | Brindle | H01L 29/78657 |
| 2020/0343380 A1 | 10/2020 | Takeuchi et al. | |
| 2020/0411645 A1 | 12/2020 | Weeks et al. | |
| 2021/0074814 A1 | 3/2021 | Stephenson et al. | |
| 2021/0091246 A1* | 3/2021 | Chern | H01L 31/035281 |
| 2021/0217875 A1 | 7/2021 | Burton | |
| 2021/0217880 A1 | 7/2021 | Burton | |
| 2021/0265509 A1 | 8/2021 | Weeks et al. | |
| 2021/0391426 A1 | 12/2021 | Takeuchi et al. | |
| 2021/0391446 A1 | 12/2021 | Takeuchi et al. | |
| 2022/0005706 A1 | 1/2022 | Weeks et al. | |
| 2022/0005926 A1 | 1/2022 | Weeks et al. | |
| 2022/0005927 A1 | 1/2022 | Weeks et al. | |

OTHER PUBLICATIONS

U.S. Appl. No. 17/653,305, filed May 26, 2021, Hytha et al. See Priority U.S. Appl. No. 17/653,305, filed Mar. 3, 2022.

U.S. Appl. No. 17/653,305, filed Oct. 28, 2021, Hytha et al. See Priority U.S. Appl. No. 17/653,305, filed Mar. 3, 2022.

U.S. Appl. No. 17/653,305, filed Mar. 3, 2022, Takeuchi et al. See Priority U.S. Appl. No. 17/653,305, filed Mar. 3, 2022.

Luo et al., "Chemical Design of Direct-Gap Light-Emitting Silicon" published in Physical Review Letters, vol. 89, No. 7; Aug. 12, 2002; 4 pgs. See Priority U.S. Appl. No. 17/653,305, filed Mar. 3, 2022.

Maurizio DiPaolo Emilio "Quantum-Engineered Material Boosts Transistor Performance" https://www.eetimes.comlquantumengineered-material-boosts-transistor-performancel# EE Times; retrieved from internet 211012022; pp. 3 See Priority U.S. Appl. No. 17/653,305, filed Mar. 3, 2022.

Mears et al. "Simultaneous Carrier Transport Enhancement and variability reduction in Si MOSFETs by insertion of partial Monolayers of oxygen" IEEE silicon Nanoelectronics Workshop: (Date of conference JOct. 11, 2012) pp. 2. See Priority U.S. Appl. No. 17/653,305, filed Mar. 3, 2022.

Novikov et al. "Silicon-based Optoelectronics" 1999-2003, pp. 1-6. See Priority U.S. Appl. No. 17/653,305, filed Mar. 3, 2022.

R. Tsu "Phenomena in silicon nanostructure device" published online Sep. 6, 2000 by Applied Physics and Materials Science & Processing, pp. 391-402 See Priority U.S. Appl. No. 17/653,305, filed Mar. 3, 2022.

R. Tsu "Si Based Green ELD: Si-Oxygen Superlattice" ysiwyg://llhttp://www3.interscience.wiley.com/cgi-bin/abstracU72512946/ start: published online Jul. 21, 2000; 2 pgs. Abstract Only. See Priority U.S. Appl. No. 17/653,305, filed Mar. 3, 2022.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016. See Priority U.S. Appl. No. 17/653,305, filed Mar. 3, 2022.

Xu et al. "Extension of planar bulk n-channel MOSFET scaling with oxygen insertion technology", IEEE Transactions on Electron devices, vol. 61, No. 9; Sep. 2014. pp. 3345-3349. See Priority U.S. Appl. No. 17/653,305, filed Mar. 3, 2022.

Xu et al., "MOSFET performance and scalability enhancement by insertion of oxygen layers", Department of Electrical Engineering and Computer Science, University of California, Berkeley, 2012, pp. 1-4. See Priority U.S. Appl. No. 17/653,305, filed Mar. 3, 2022.

* cited by examiner

RADIO FREQUENCY (RF) SEMICONDUCTOR DEVICES INCLUDING A GROUND PLANE LAYER HAVING A SUPERLATTICE

RELATED APPLICATIONS

This application is a continuation application of U.S. patent application Ser. No. 17/653,305 filed Mar. 3, 2022, which claims the benefit of U.S. Provisional Application Ser. No. 63/156,052 filed Mar. 3, 2021, and U.S. Provisional Application Ser. No. 63/159,714 filed Mar. 11, 2021, which are hereby incorporated herein in their entireties by reference.

TECHNICAL FIELD

The present disclosure generally relates to semiconductor devices and, more particularly, to radio frequency (RF) semiconductor devices and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2, 347, 520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A radio frequency (RF) semiconductor device may include a semiconductor-on-insulator substrate, and an RF ground plane layer on the semiconductor-on-insulator substrate comprising a conductive superlattice. The conductive superlattice may include a plurality of stacked groups of layers, with each group of layers comprising a plurality of stacked doped base semiconductor monolayers defining a doped base semiconductor portion, and at least one non-semiconductor monolayer constrained within a crystal lattice of adjacent doped base semiconductor portions. The RF semiconductor device may further include a body above the RF ground plane layer, spaced apart source and drain regions adjacent the body and defining a channel region in the body, and a gate overlying the channel region.

In an example embodiment, the RF semiconductor device may be an RF switch. The RF semiconductor device may also include a body contact coupled to the body and the RF ground plane layer. By way of example, the body contact may include first and second body contact portions adjacent opposite ends of the channel region.

In accordance with an example implementation, the RF ground plane may have a thickness in a range of 10-50 nm. Furthermore, the doped base semiconductor portions may have a dopant concentration of at least $5 \times 10^{17}$ cm$^{-3}$, for example. The gate may include a gate insulator over the channel region, and a gate electrode over the gate insulator.

Also by way of example, the doped base semiconductor monolayers may comprise silicon, and the non-semiconductor monolayers may comprise oxygen. The semiconductor-on-insulator substrate may comprise a silicon-on-insulator (SOI) substrate, for example.

DETAILED DESCRIPTION

Figure 1:
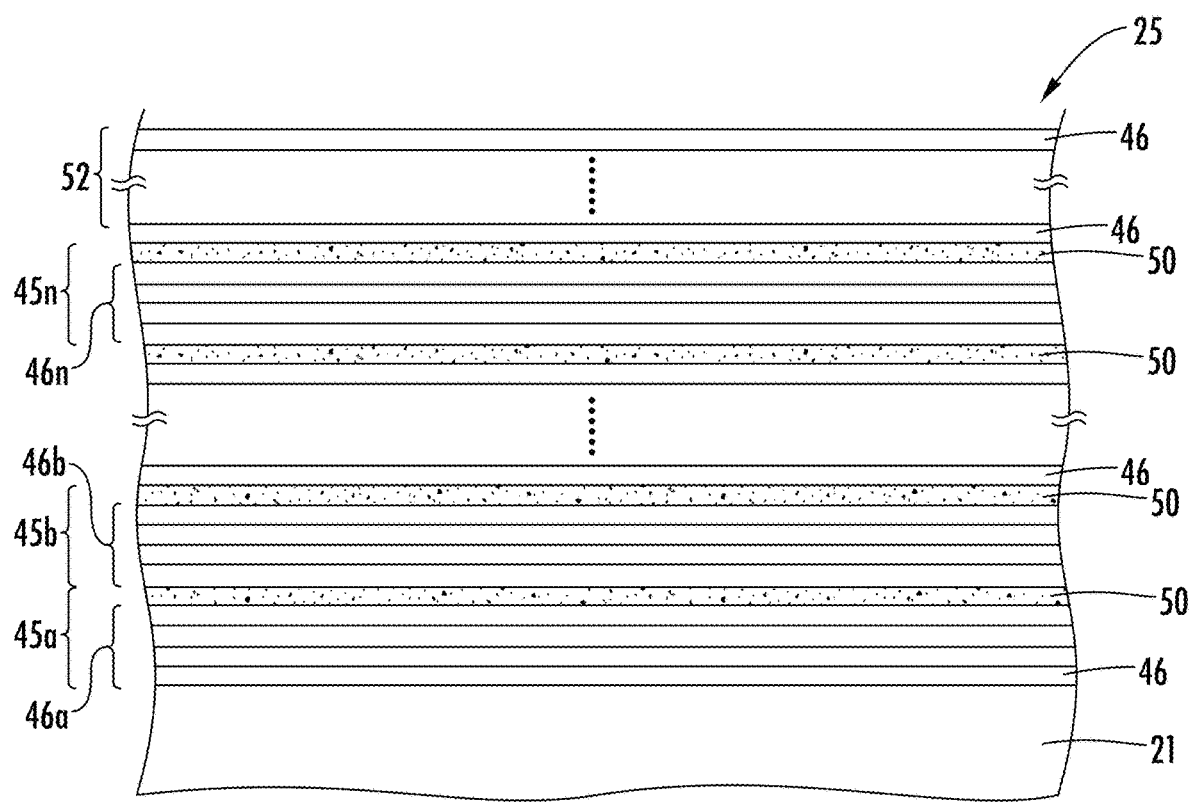
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to radio frequency (RF) semiconductor-on-insulator (SOI) devices having an enhanced semiconductor superlattice therein to provide performance enhancement characteristics. The enhanced semiconductor superlattice may also be referred to as an "MST" layer or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
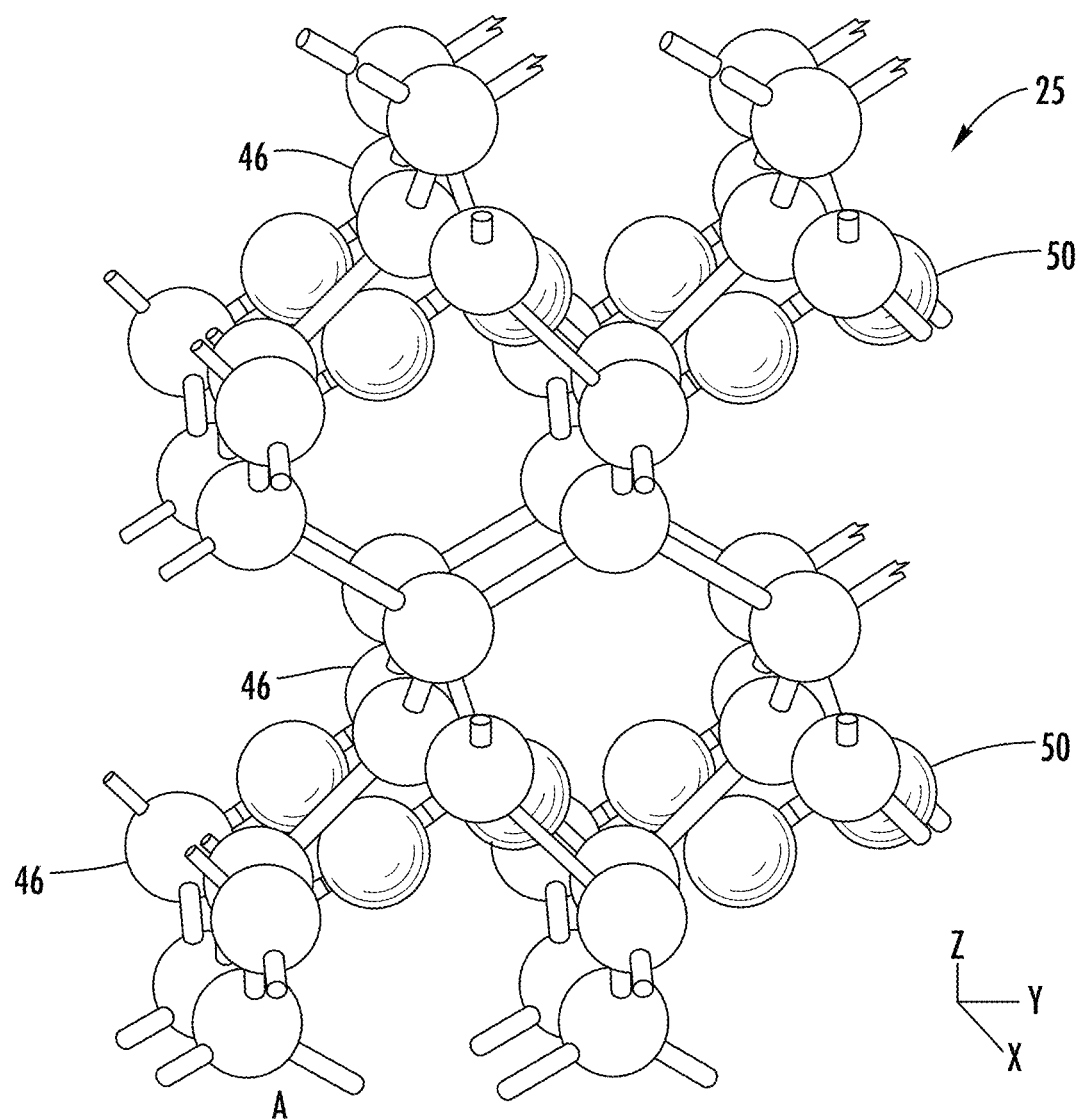
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
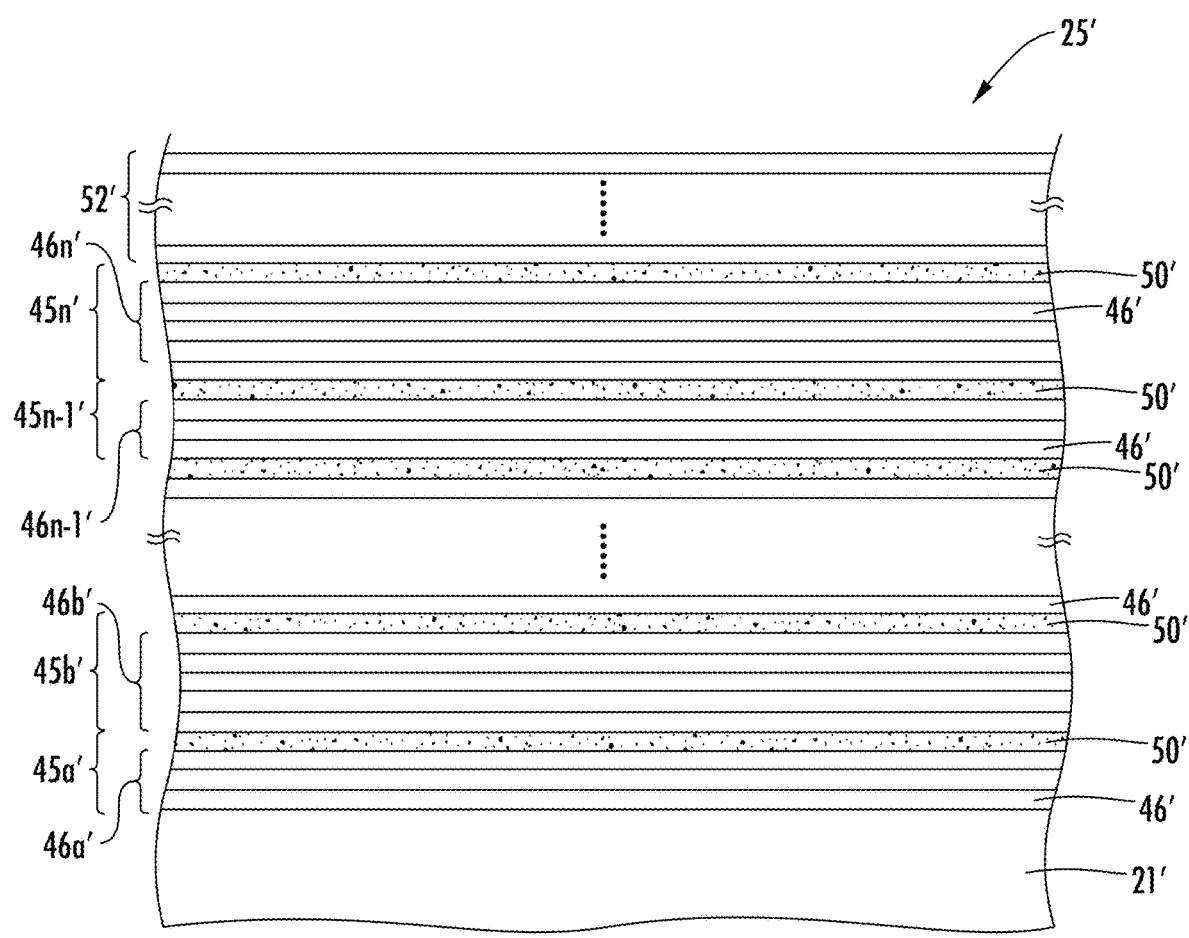
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
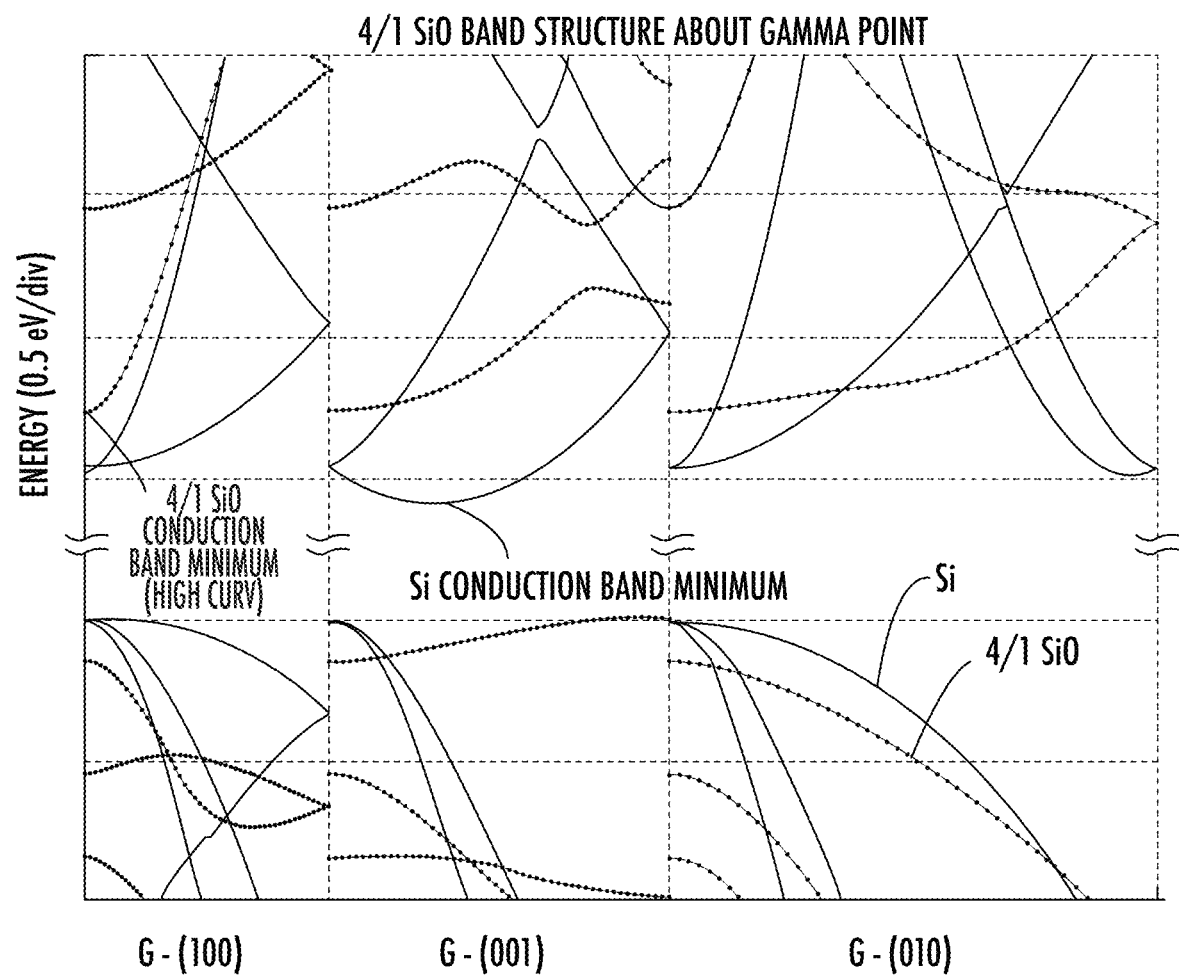
FIG. 4A is a graph of the calculated band structure from the gamma point (G) for both bulk silicon as in the prior art, and for the 4/1 Si/O superlattice as shown in FIGS. 1-2.
Figure 4B:
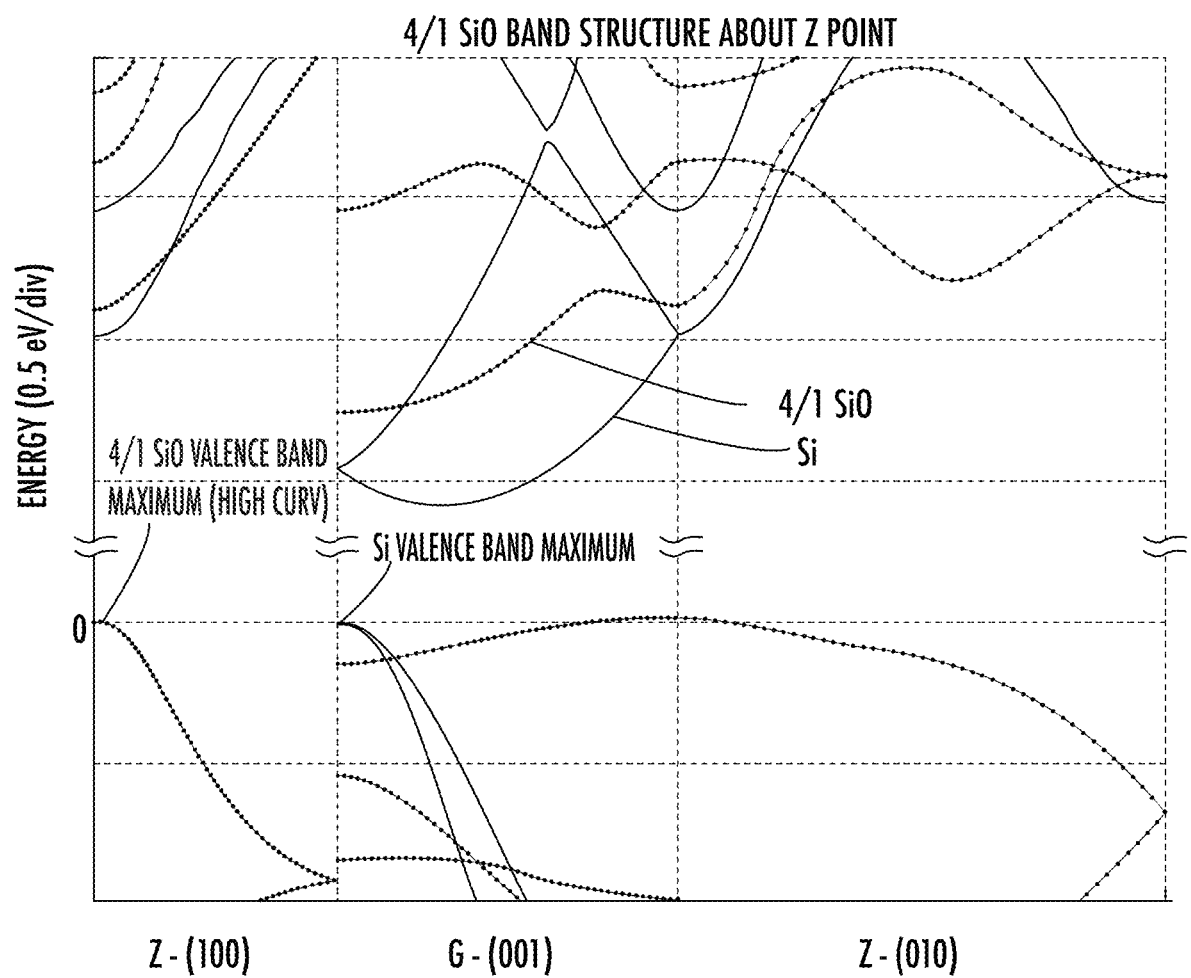
FIG. 4B is a graph of the calculated band structure from the Z point for both bulk silicon as in the prior art, and for the 4/1 Si/O superlattice as shown in FIGS. 1-2.
Figure 4C:
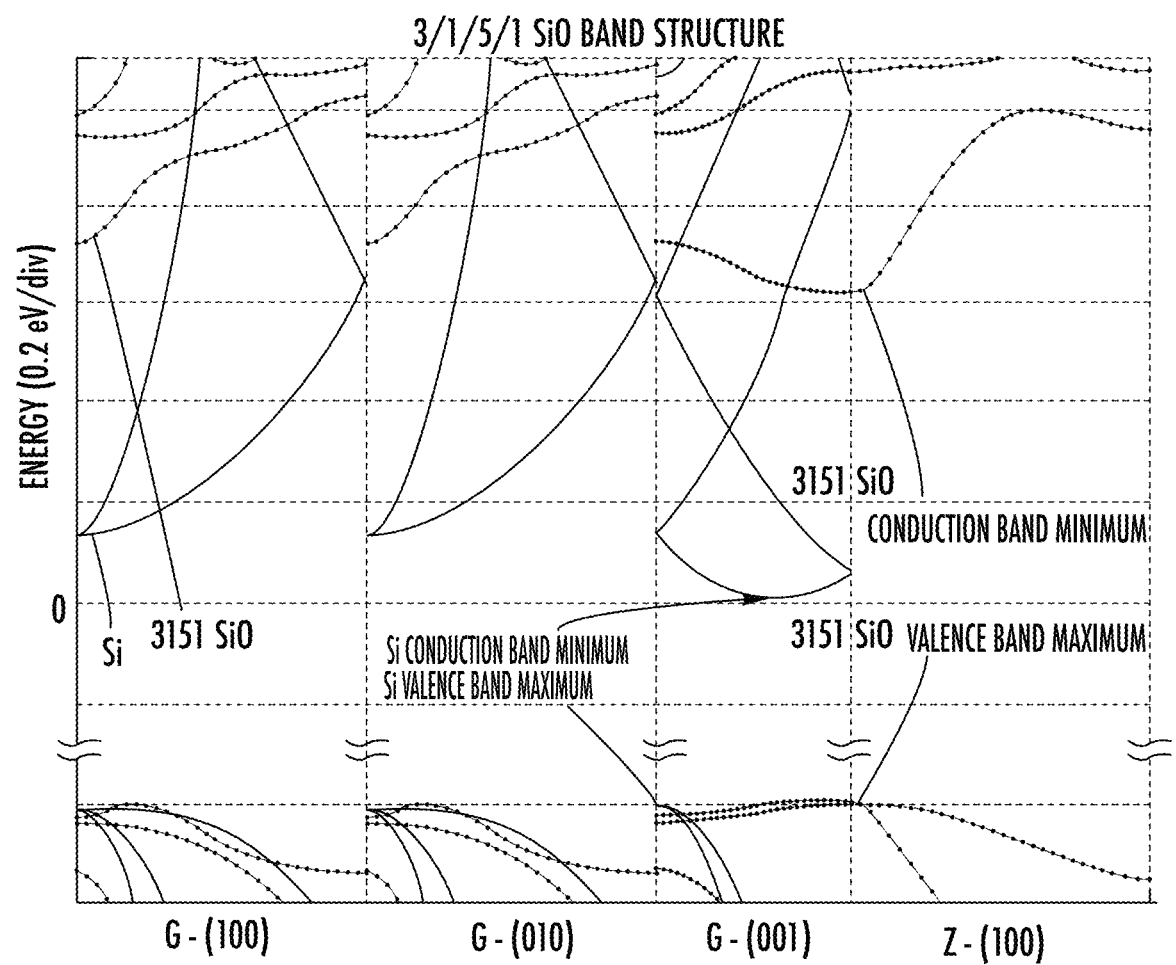
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (-110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
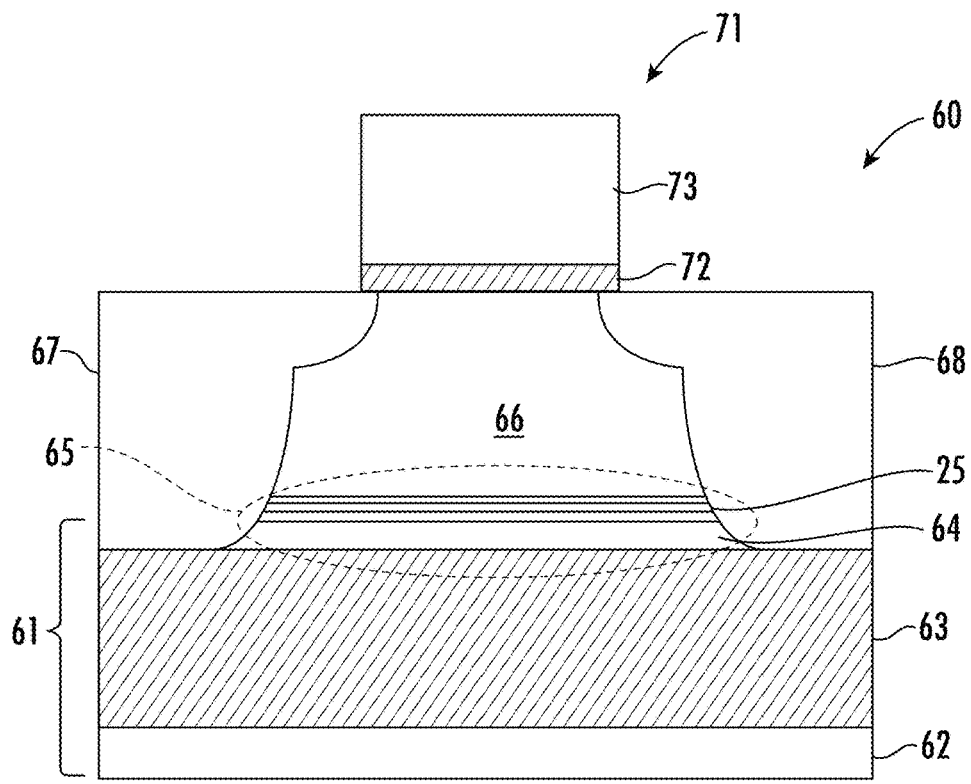
FIG. 5 is a schematic cross-sectional diagram of a radio frequency (RF) semiconductor device including a superlattice defining a ground plane in an example embodiment.
Figure 6:
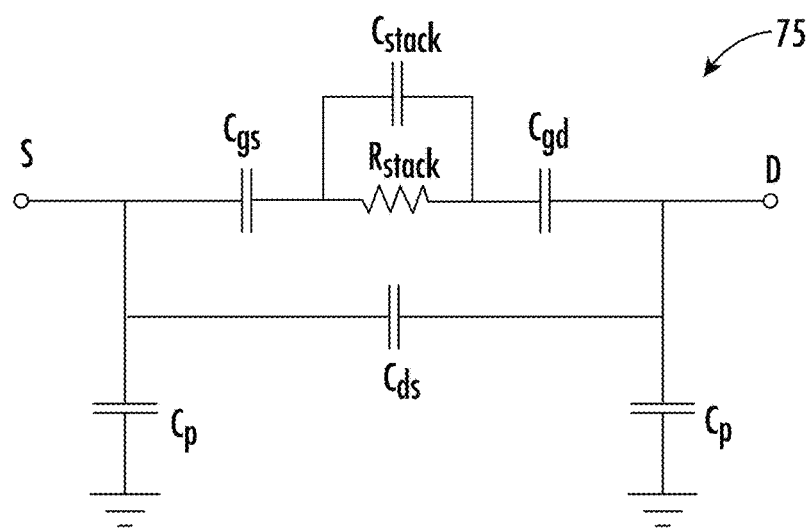
FIG. 6 is a circuit diagram of an equivalent electrical circuit for the RF semiconductor device of FIG. 5.

Referring now additionally to FIGS. 5 and 6, the above-described superlattice structures may advantageously be used to provide radio frequency (RF) semiconductor-on-insulator devices. By way of background, typical RF silicon-on-insulator (SOI) devices have a number of different breakdown mechanisms. NMOS RF-SOI switches may be quite wide (on the order of 10 μm) to handle sufficient current, and the thin silicon on buried oxide (BOX) architecture means that the body tie is placed at the edge of the width. Holes generated by impact ionization and otherwise have to traverse up to half of the width to reach the body contact. For short gate lengths and wide devices, the resistive path to the contact may be significant, causing a rise in body potential toward the middle of the device. If the potential rise is great enough, the body-source junction may be forward biased, and a parasitic n-p-n (source-body-drain) may be triggered, leading to a run-away source-drain current.

In an example embodiment, an RF semiconductor device 60 advantageously incorporates an MST layer, such as those described above, to advantageously provide for a more highly doped "ground plane" (GP) above the BOX, yet which is constrained to the lower portion of the silicon-on-BOX such that it does not cause a high threshold voltage (Vt) or otherwise impair the operation of the device. The RF-SOI device 60 illustratively includes a semiconductor-on-insulator substrate, and an RF ground plane layer on the semiconductor-on-insulator substrate including a semiconductor (e.g., silicon) substrate layer 62, a BOX layer 63 (e.g., SiO_), and a semiconductor (e.g., silicon) layer 64 on the BOX layer. A conductive superlattice 25 (such as the MST superlattice layers described further above) is above the semiconductor layer 64. More particularly, the conductive superlattice 25 and semiconductor layer 64 below the superlattice are highly doped to define the ground plane 65. It should be noted that in some embodiments, portions of the body 66 directly above the superlattice 25 may also include ground plane dopant and define a portion of the ground plane 65. Moreover, in the illustrated embodiment the superlattice 25 is selectively deposited in the ground plane 65 region, but in other embodiments a blanket superlattice deposition across the entire substrate 61 may be used, as will be discussed further below.

The RF semiconductor device 60 further illustratively includes a body 66 above the RF ground plane layer 65, spaced apart source and drain regions 67, 68 adjacent the body and defining a channel region 70 in the body, and a gate 71 overlying the channel region. The gate 71 illustratively includes a gate insulator 72 (e.g., $SiO_2$) over the channel region 70, and a gate electrode 73 (e.g., polysilicon) over the gate insulator.

An equivalent circuit diagram 75 for the RF semiconductor device 60 is shown in FIG. 6. For the discussion and examples that follow, a SOI device with Si/O superlattices will be used, although those skilled in the art will appreciate that other materials may be used in different embodiments as discussed further above. Generally speaking, a thinner SOI layer 64 enables lower Coff due to lower Cds ($\propto$ Tsoi). Yet, SOI thickness scaling is constrained by breakdown characteristics, as a thinner SOI layer 64 is more susceptible to hole accumulation to trigger a parasitic BJT effect. Accordingly, SOI layer thicknesses of current state-of-the art RF-SOI devices is typically in the 50-75 nm (final) range. Furthermore, due to the use of relatively thick gate oxides (tox=6 nm) for Vdd=2.5V, which is necessary to handle RF signals, gate length scaling in typical RF-SOI devices is generally around Lg=100 nm.

Through simulation, Applicant has determined that a ground plane doping immediately above the BOX layer 63 in a range of 10-20 nm thickness and $5E17$ $cm^{-3}$, and more preferably $1E18$ $cm^{-3}$, doping (or above) may significantly improve the breakdown voltage of RF-SOI devices (e.g., by up to 1V for a 5V device). If other device characteristics are not impaired, this leads to a significant improvement in the key metric of Ron-BV, where Ron is the ON state resistance. It has also been verified through simulation that example RF-SOI devices incorporating an MST film may advantageously maintain or reduce the junction capacitance, and hence the Coff, thus improving another key metric, namely Ron-Coff versus BV.

More particularly, the superlattice 25 effectively forms the ground-plane doping layer, confining dopants (e.g., boron for an N channel device) at the interface between the BOX layer 63 and SOI layer 64. Furthermore, the ground plane 65 also serves as a Vt adjustment doping layer. The illustrated structure also allows for scaling SOI to desirable thicknesses, e.g., down to 35 nm or less. In addition, the approach is also effective in gate length scaling as well, with simulations projecting desirable gate control for Lg=65 nm devices.

Figure 7:
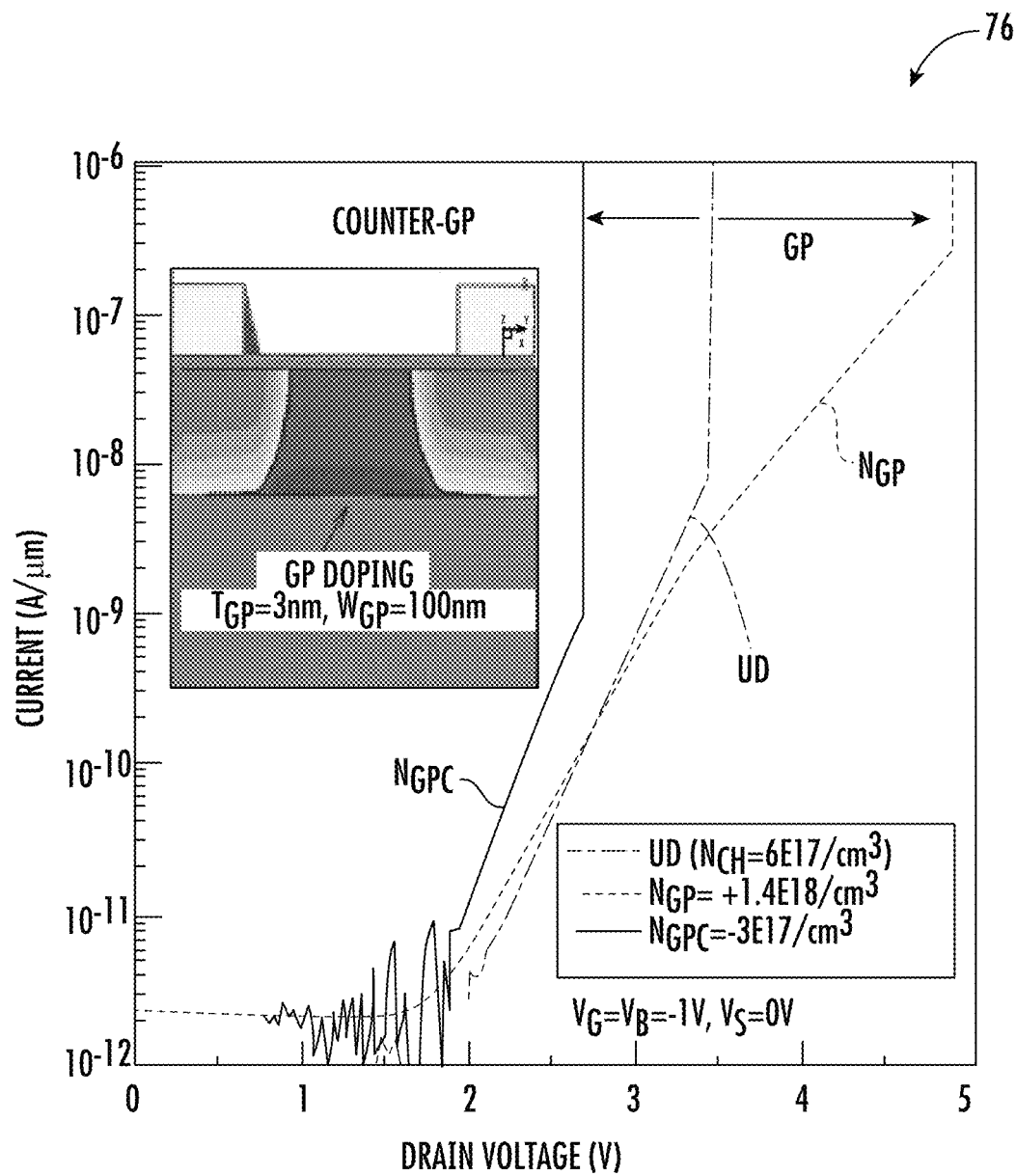
FIG. 7 is a graph of current vs. drain voltage illustrating the effect of the ground plane of the RF semiconductor device of FIG. 5 on breakdown characteristics in an example simulation.
Figure 8:
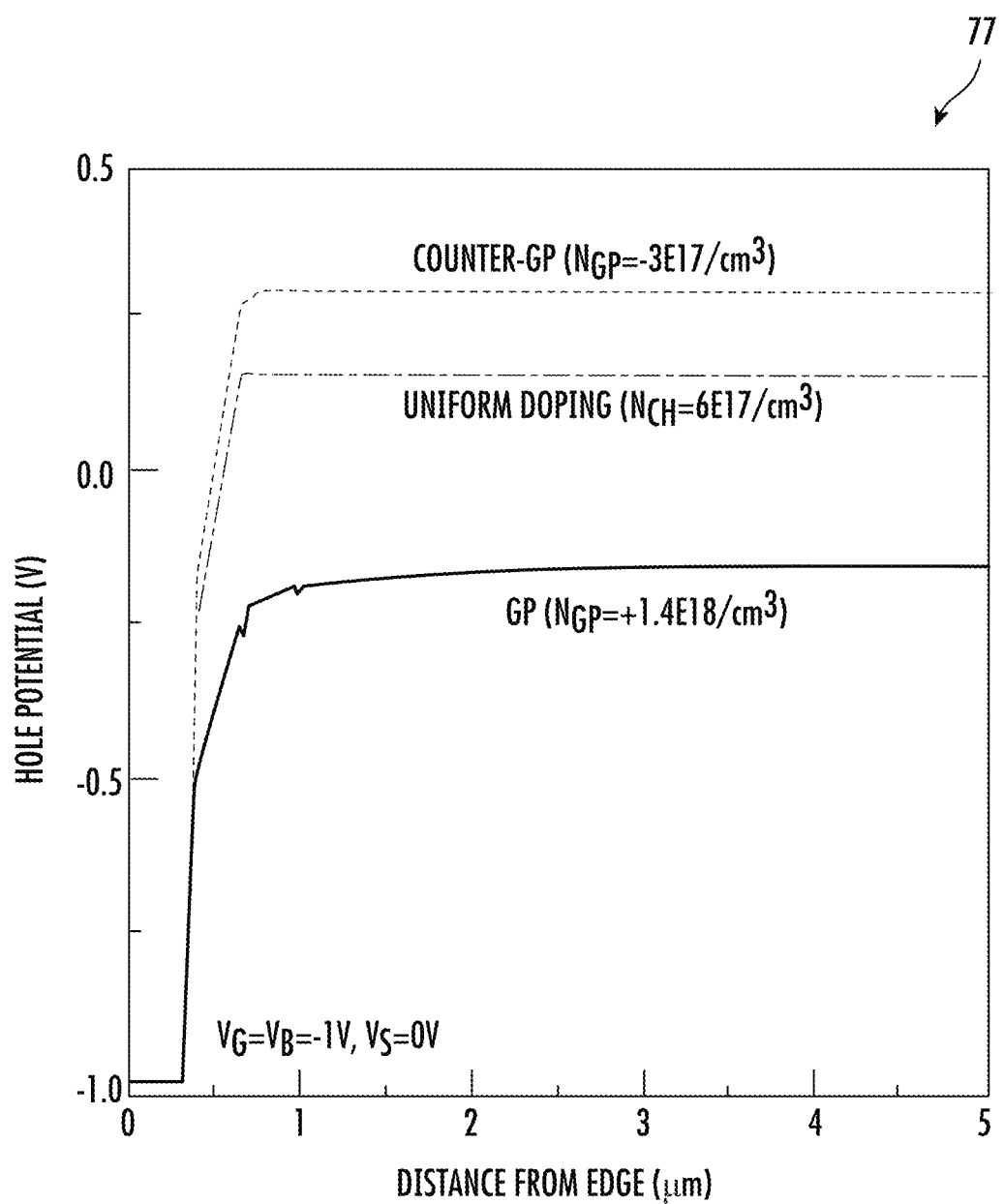
FIG. 8 is a graph of hole potential vs. distance illustrating hole potential along the channel for the example simulation shown in FIG. 7.

Another consideration with conventional RF-SOI devices is body potential increase due to SOI body pinch-off. More particularly, typical SOI body pinches off at approximately 0.5 um from the body contact, and holes may accumulate at the gate oxide interface due to a negative bias. As a result, the rest of the Sol body is depleted, and body potential may be raised due to the pinch off. Yet, the ground plane 65 of the device 60 advantageously improves breakdown voltage (BV) by accumulating and retaining dopant (e.g., boron) at the SOI/BOX interface, mitigating body potential increase by body resistance reduction. On the other hand, removal of boron from the SOI/BOX interface (counter-GP) degrades BV, as seen in the graph 76 of FIG. 7 illustrating breakdown characteristics for simulations of the illustrated configuration. The graph 77 of FIG. 8 shows the corresponding hole potential along the channel for counter-GP, uniform doping, and GP.

Figure 9:
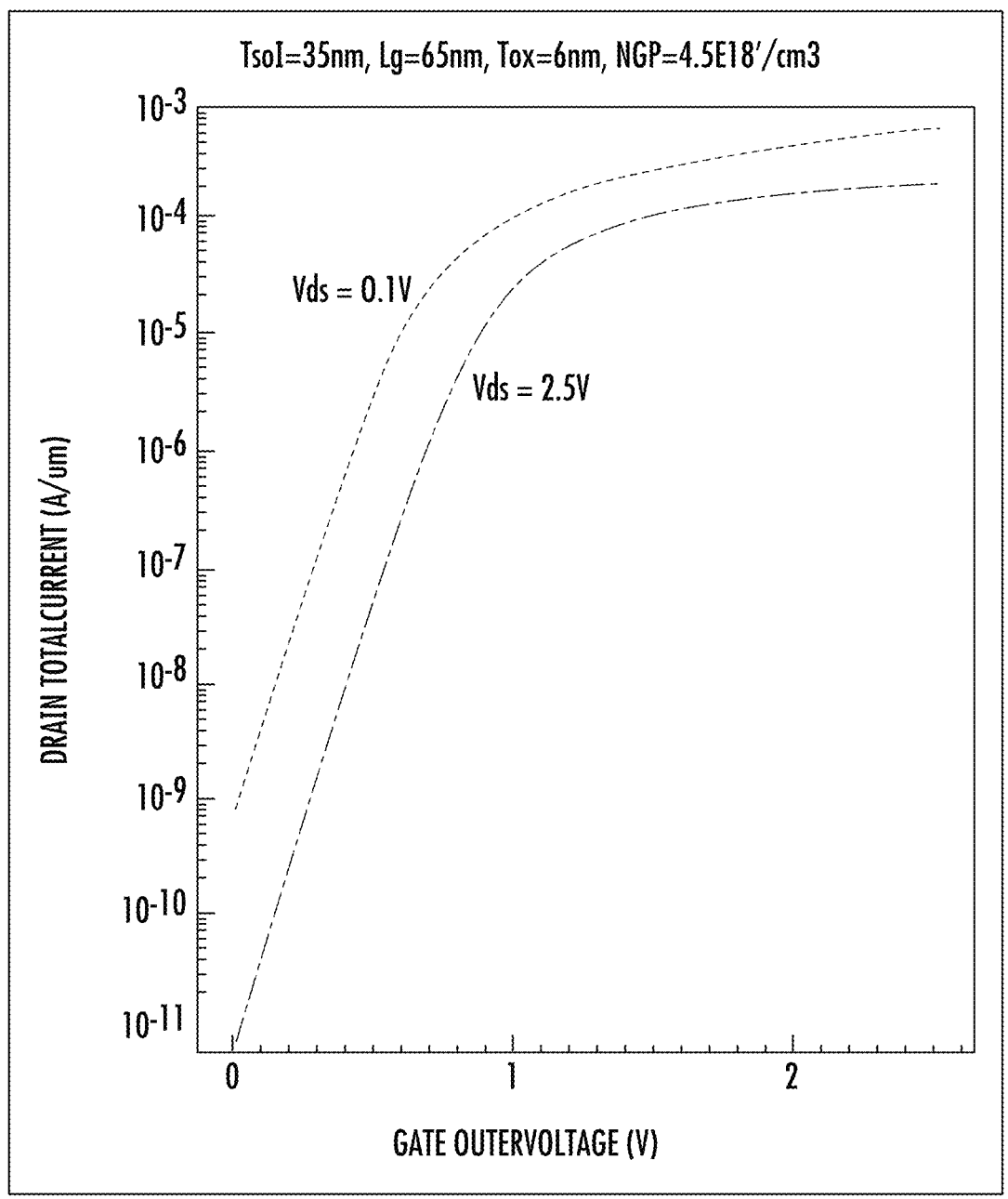
FIG. 9 is a graph of TCAD simulation results for drain current vs. gate voltage for an example implementation of the RF semiconductor device of FIG. 5.
Figure 10:
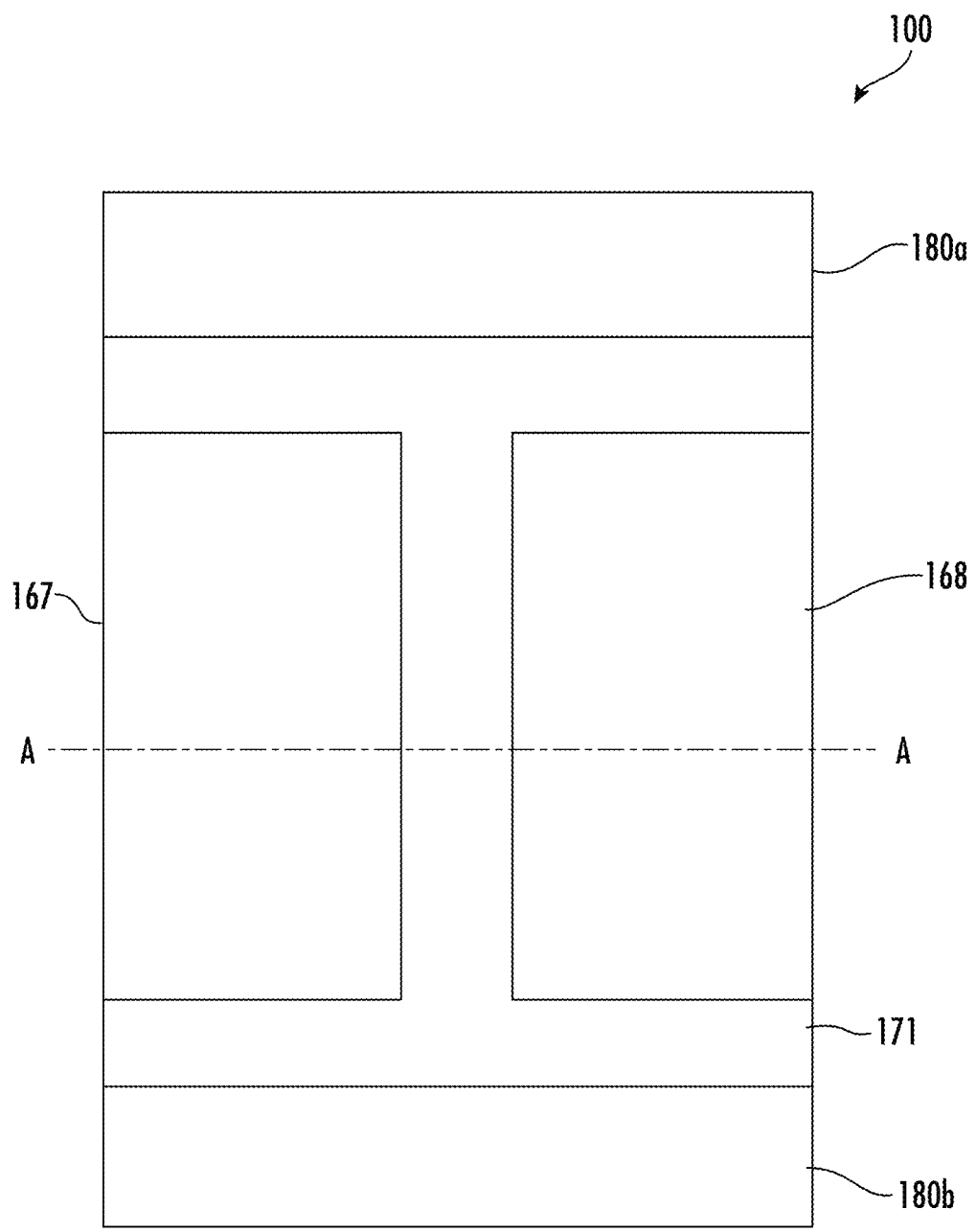
FIG. 10 is a top plan view of another RF semiconductor device similar to that of FIG. 5.

In an example technology computer-aided design (TCAD) simulation of the device 60, the following parameters were used: gate length LG=65 nm; thickness of the silicon between the BOX 63 and gate 71 $T_{SOI}$=35 nm; thickness of the ground plane 65 $T_{GP}$=20 nm; n-type dopant concentration of the ground plane $N_{GP}$=4.5E18/$cm^3$; body 66 thickness TSSR=15 nm; n-type dopant concentration in the channel Nch=1E16/$cm^3$; n-type dopant concentration in the lightly-doped drain region $N_{LDD}$=2E19/$cm^3$; thickness of the lightly-doped drain region $X_J$=20 nm (at 4E18/$cm^3$); and an offset spacer=12.5 nm. The projected electrical performance values from the simulation were as follows: $R_{DSON}$=452 ohm-um ($I_{DLIN}$=221 uA/um at $V_{DS}$=0.1V); $I_{OFF}$=0.8 nA/um; $V_{TLIN}$=0.700V; and $V_{TSAT}$=0.439V. These results are shown in the graph 78 of FIG. 9.

Generally speaking, MST layers may be used to advantageously maintain and/or create the highly doped ground plane 65 using various example approaches. In one example embodiment, the entire silicon-on-BOX region is fabricated to have p-doping of the desired ground plane specification (e.g., greater than approximately $1E18$ $cm^{-3}$). MST deposition is then applied either to the whole starting substrate, or selectively to only the NMOS switch devices after an appropriate etch in those regions.

If regular undoped silicon epitaxy is applied to the substrate 61, up-diffusion of the p-type dopant (typically boron) during epitaxy will occur into the whole thickness of the silicon layer 64 on the BOX layer 63, and this diffusion will be further enhanced during the gate oxidation process (and any other thermal annealing steps) so that the silicon-on-BOX will be much more uniformly doped at the end of the process and the advantage of the GP doping will be lost. However, this may be advantageous for the creation of other NMOS and PMOS devices such as those required for CMOS low-noise amplifiers and other circuit elements, since the reduced p-type doping of the silicon-on-BOX may be more readily counter-doped to create the PMOS devices.

More particularly, the growth of MST layers will both trap the p-type dopant and inhibit up-diffusion, by absorbing silicon self-interstitials, which mediate diffusion for many dopants, including boron and phosphorus. Thus, where MST is applied, the ground plane doping will be held in place. If needed, the doping close to the BOX may also be enhanced by a subsequent implant. The MST layers will also serve to trap this implanted dopant. In the case where MST is applied in a blanket deposition across the whole wafer on a previously p-doped ground plane, Applicant speculates without wishing to be bound thereto that it will still be possible to create PMOS devices where required by counter-doping, since the MST layer will also strongly trap n-type dopants such as phosphorus.

In an example implementation, a starting silicon-on-insulator substrate with a silicon-on-BOX p-type doping (e.g., above 5E17) may be provided, along with MST layers (as described further above) in the silicon-on-BOX region such that the remainder of the silicon above the MST layers is substantially un-doped (and >10 nm depth, for example).

In accordance with another example, a starting silicon-on-insulator substrate is provided where the desired ground plane p-type doping (e.g., above 5E17 cm$^{-3}$) is implanted. MST layers (as described further above) are also provided in the silicon-on-BOX region such that the remainder of the silicon above the MST layers is substantially un-doped.

Turning to FIGS. 10 and 11A-11H, an example NMOS RF switch device 100 and associated fabrication steps are now described in greater detail. The cross-sectional views shown in FIGS. 11A-11H are taken along the line A-A of FIG. 10. The device 100 illustratively includes a body contact with first and second body contact portions 180a, 180b at opposing edges of the device along its width. A source 167 and drain 168 are on opposite sides from the gate 171. For an NMOS configuration, the device 100 may include a ground plane 165 created from the starting substrate 161 with p-type doping above the BOX layer 163 greater than, e.g., 5E17 cm$^{-3}$ (and, more preferably, greater than 1E18 cm$^{-3}$). However, in some embodiments a PMOS device may also be created using the substrate by counter-doping the p-type ground plane 165 by implantation into and below the MST region, as will be appreciated by those skilled in the art.

Figure 11A:
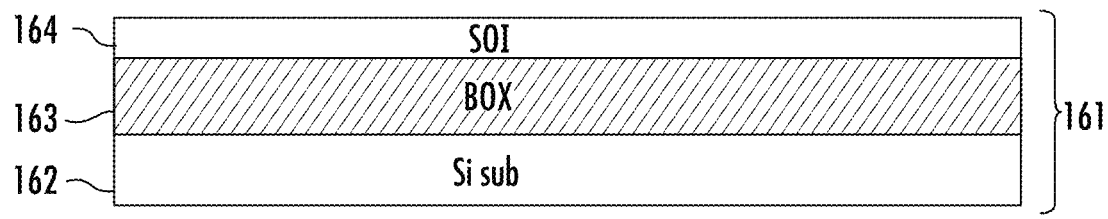
FIGS. 11A-11H are a series of cross-sectional diagrams taken along line A-A of FIG. 10 illustrating an example method for making the device thereof.
Figure 11B:
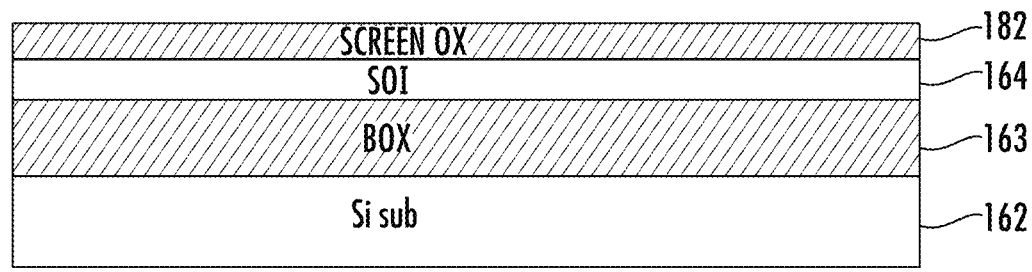
Figure 11C:
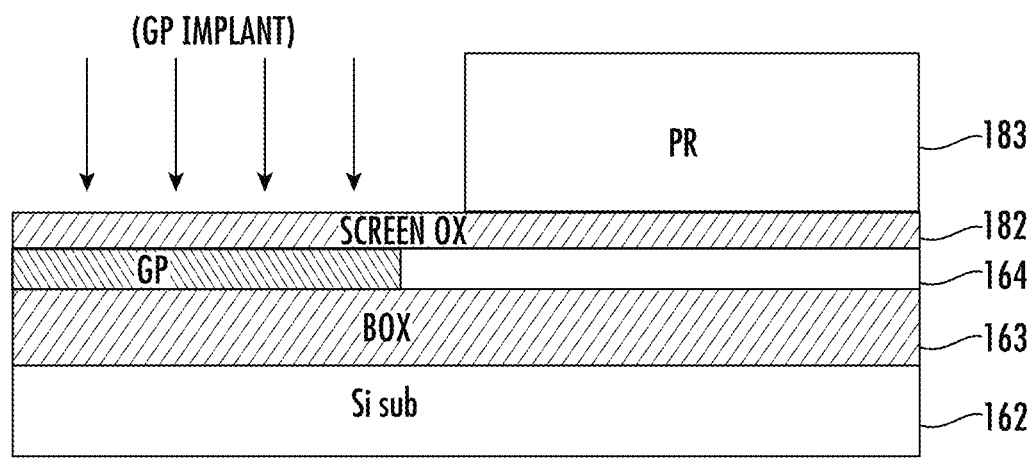
Figure 11D:
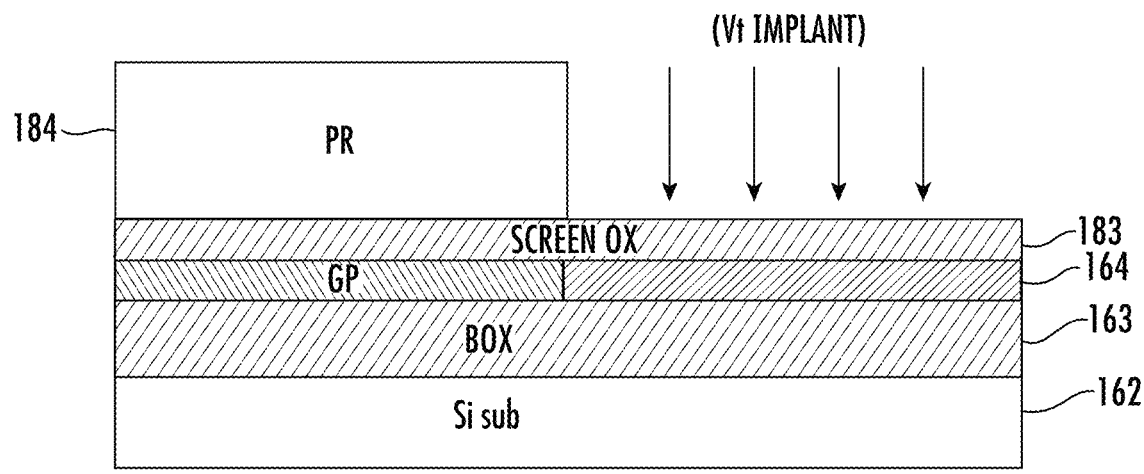
Figure 11E:
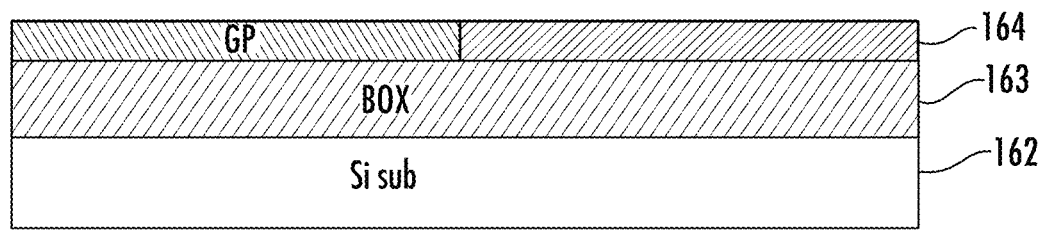

Fabrication of the device 60 begins with the growth of a screen oxide 182 on the starting SOI substrate or wafer 161 (FIG. 11B), which illustratively includes the silicon layer or substrate 162, BOX layer 163, and SOI layer 164. A photoresist (PR) mask 183 is selectively formed over the screen oxide 182 exposing the area where the ground plane 165 is to be formed, and a ground plane implant is then performed (FIG. 11C). In this example, the NMOS with the ground plane 165 is an RF switch. That is, a gate 171a of the RF switch controls charge carrier flow through the channel region responsive to an RF switching control signal. The mask 183 is removed, and then a second PR mask 184 is selectively deposited to expose the area where a Vt adjustment implant 186 is to be formed in another NMOS RF device as shown in FIG. 11D. By way of example, P-type doping for the Vt implant 186 may be in a range of about E17 cm$^{-3}$.

Figure 11F:
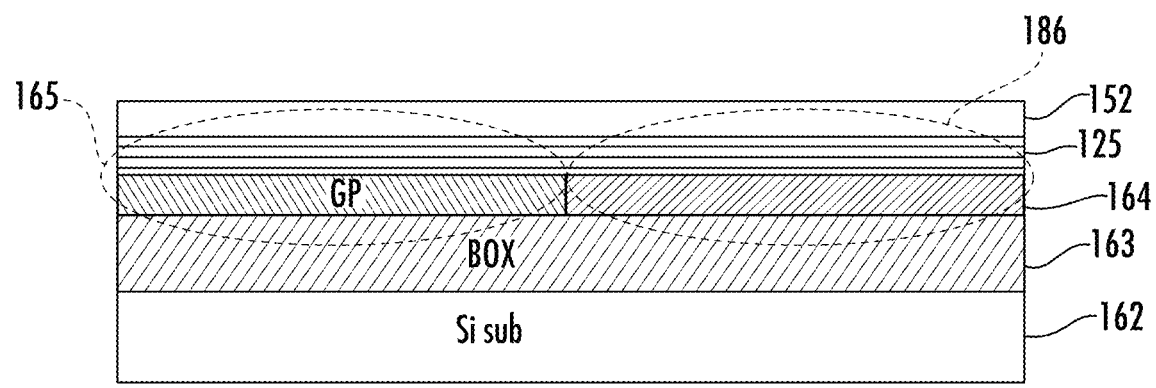
Figure 11G:
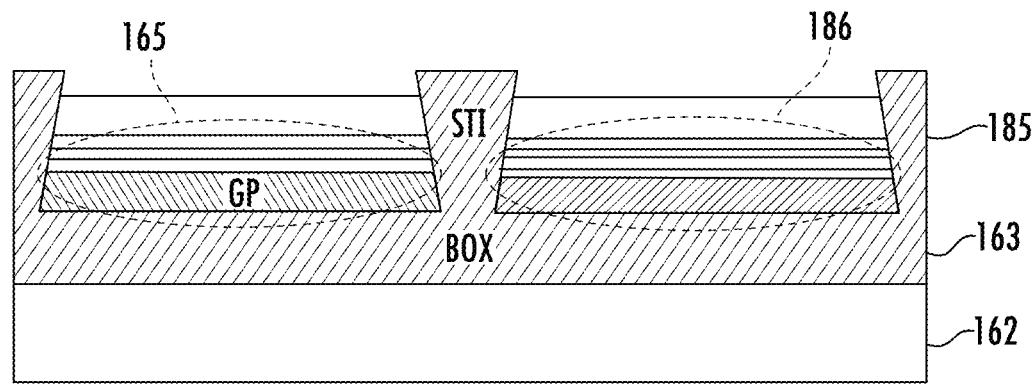
Figure 11H:
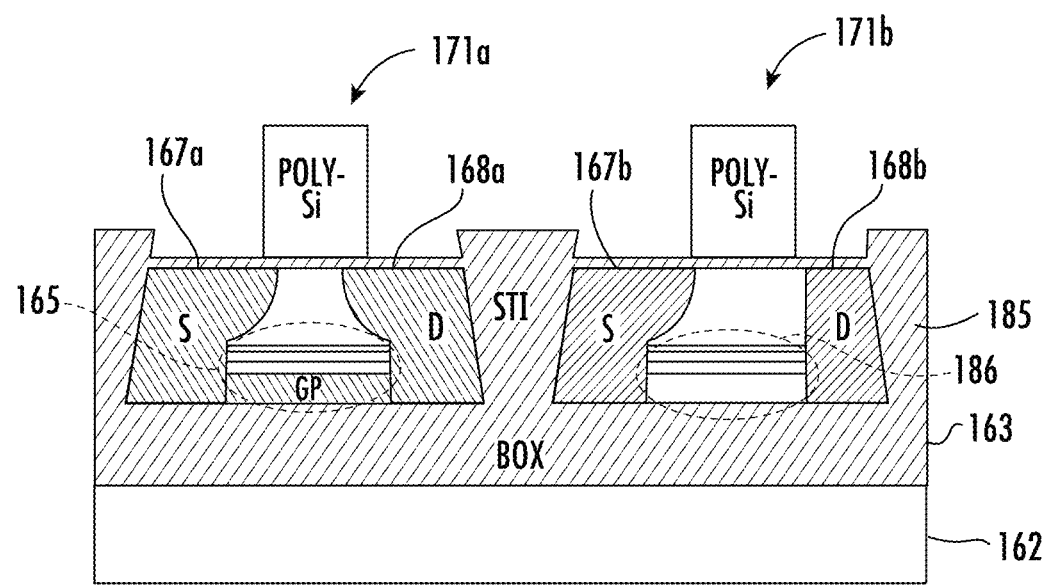

After removal of the second PR mask 184 and screen oxide 183 (FIG. 11E), a blanket MST growth is performed to define a superlattice 125, followed by the epitaxial growth of a silicon cap layer 152 (FIG. 11F). A shallow trench isolation (STI) module is performed to define STI regions (e.g., SiO2) between the different NMOS devices, followed by a source/drain module to define sources 167a, 167b and drains 168a, 168b in both of the transistors and a gate module to define gates 171a, 171b (FIG. 11H).

Figure 12A:
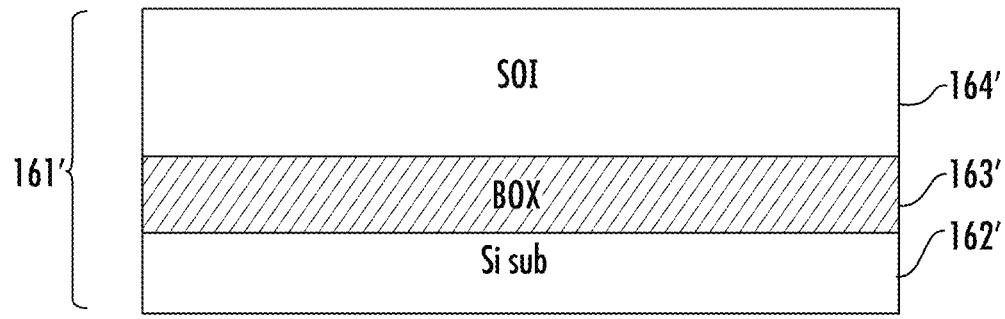
FIGS. 12A-12G are a series of cross-sectional diagrams taken along line A-A of FIG. 10 illustrating another example method for making the device thereof.
Figure 12B:
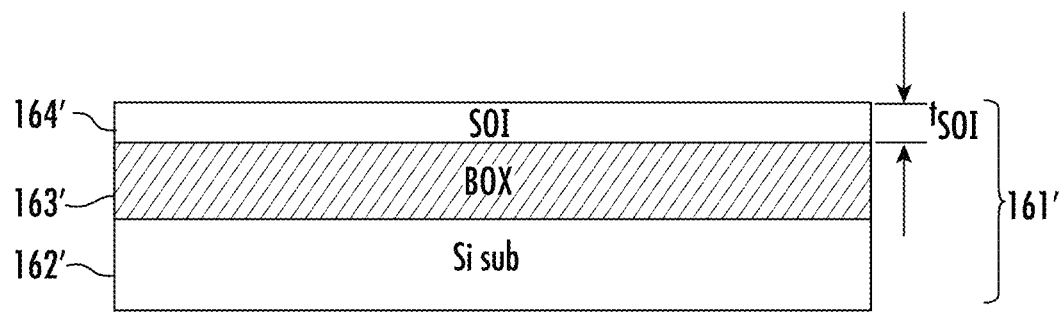
Figure 12C:
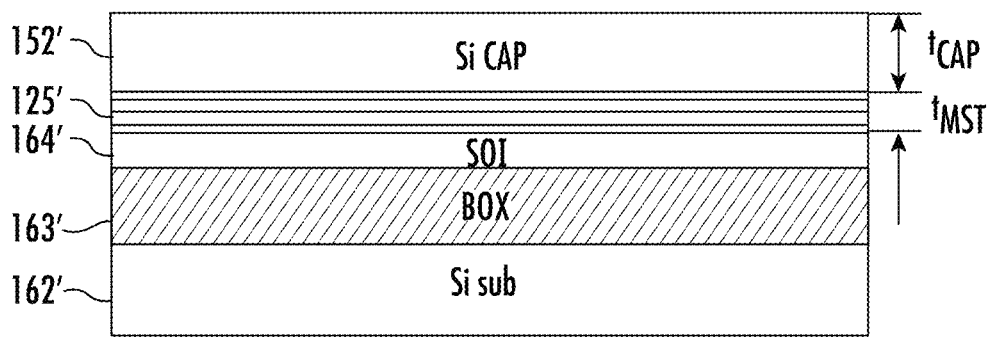
Figure 12D:
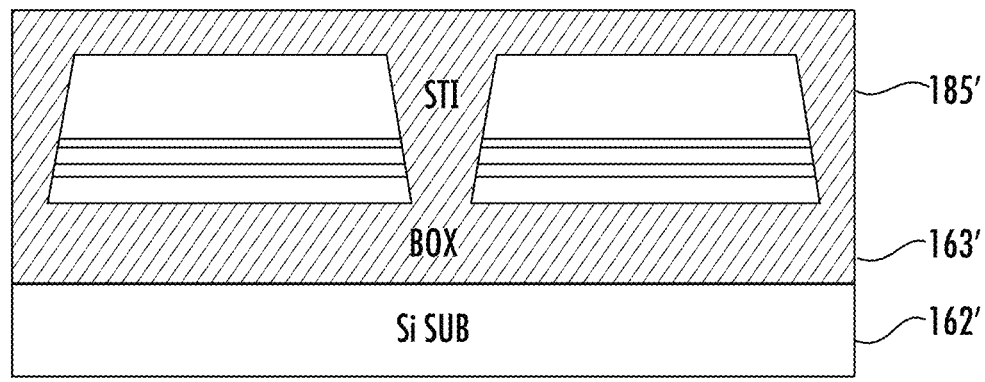
Figure 12E:
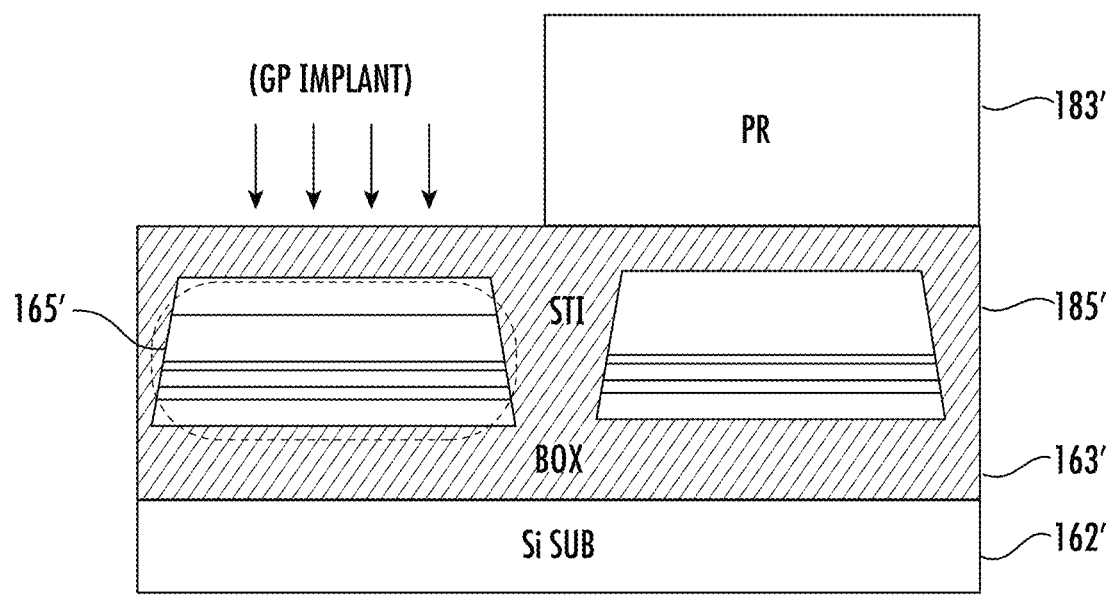
Figure 12F:
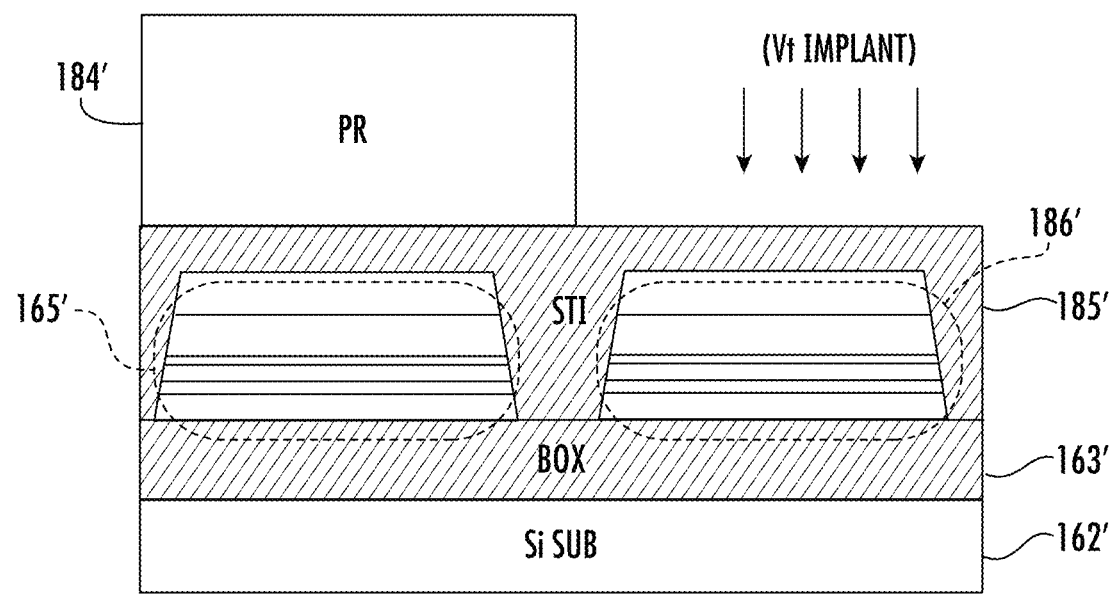
Figure 12G:
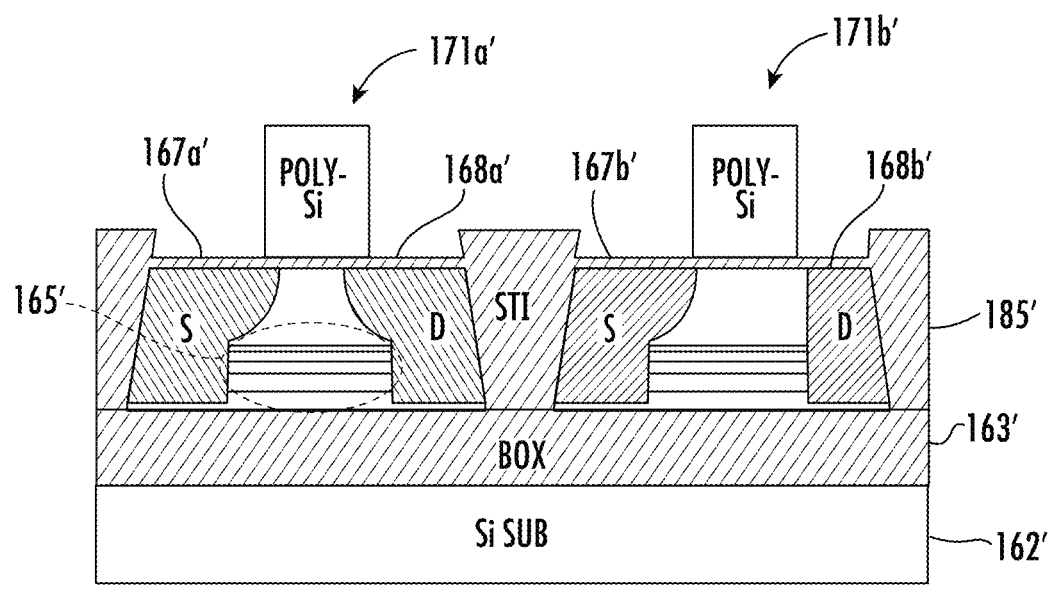

Another example fabrication approach is now described with reference to FIGS. 12A-12C. The finished device will appear the same from a top plan view as the device 100 shown in FIG. 10, and the cross-sectional views shown in FIGS. 12A-12H are similarly taken along the line A-A of FIG. 10. From the starting SOI wafer 161' (FIG. 12A), the SOI layer 164' is thinned to the desired thickness $t_{SOI}$ by oxidation or wet etching (FIG. 12B), for example. Generally speaking, the value of $t_{SOI}$ should be thin enough to allow for the ground plane formation, and may be in a range of 5-25 nm in one example implementation. A blanket MST layer deposition is performed to form the superlattice layer 125', followed by silicon cap layer 152' formation (FIG. 12C). By way of example, a thickness $t_{MST}$ of the superlattice 125' may be in a range of 5-15 nm, while a thickness of the silicon cap layer 152' may be in a range of 15-50 nm, although other thicknesses may be used in different embodiments.

Following an STI module (FIG. 12D), a first PR mask 183' is formed and the ground plane implant is performed (FIG. 12E), as similarly described above. Thereafter, the first PR mask 183' is removed, the second PR mask 184' is formed, followed by the Vt implant 186', as discussed further above. It should be noted that, in some embodiments, the order in which the GP implant 165' and the Vt implant 186' are formed may be reversed, if desired. Device fabrication concludes with a source/drain module defining sources 167a', 167b' and drains 168a' and 168b', and a gate module defining gates 171a' and 171b'. Here again, the device with ground plane 165' is an RF switch, although the above-described ground plane configurations may be used in other RF devices as well.

Figure 13:
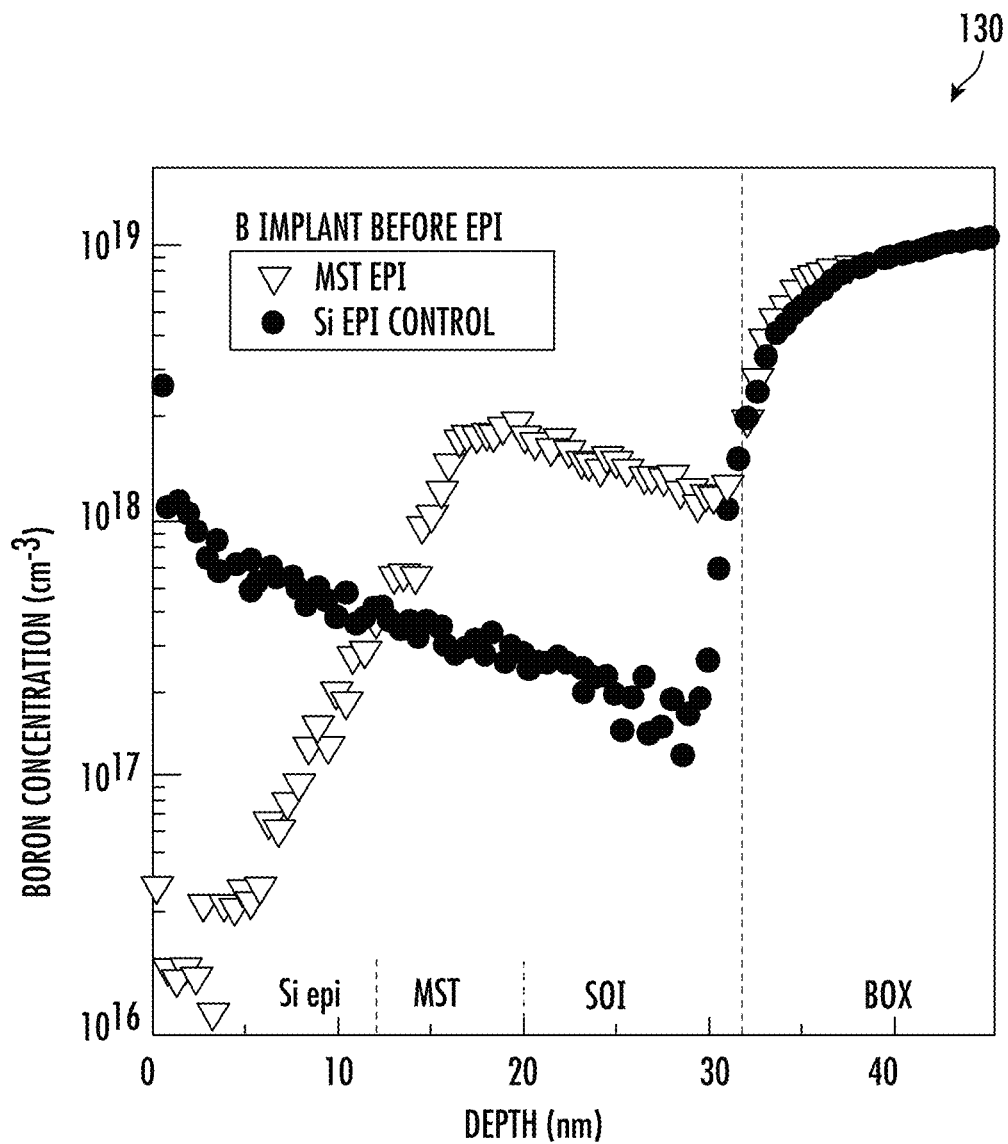
FIG. 13 is a graph of boron concentration vs. depth for SIMS data corresponding to the approach set forth in FIGS. 11A-11H in which the MST layer is deposited after ground plane doping.

Secondary Ion Mass Spectrometer (SIMS) was used to confirm the viability of ground plane and Vt implant doping by locating an MST film near a BOX layer, as discussed above, and the results are shown in the graph 130 of FIG. 13. In the example implementation, the SOI layer was thinned down to 12 nm, and a ground plane boron implantation of 10 keV at 4.0E13 was performed before the MST film deposition.

Figure 14:
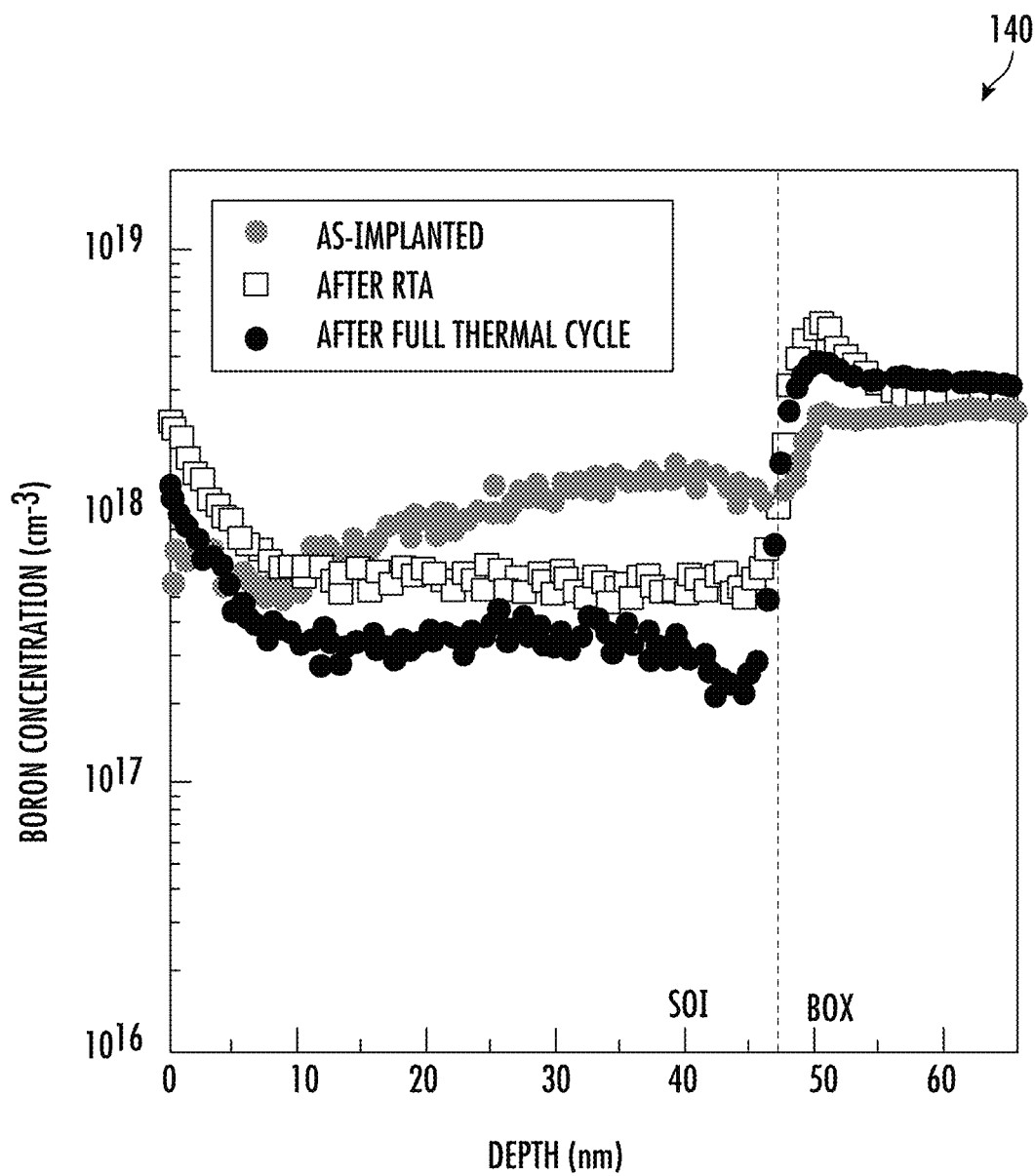
FIGS. 14 and 15 are graphs of boron concentration vs. depth for SIMS data respectively corresponding to a silicon epi control structure and to the approach set forth in FIGS. 11A-11H in which the MST layer is deposited before ground plane doping.
Figure 15:
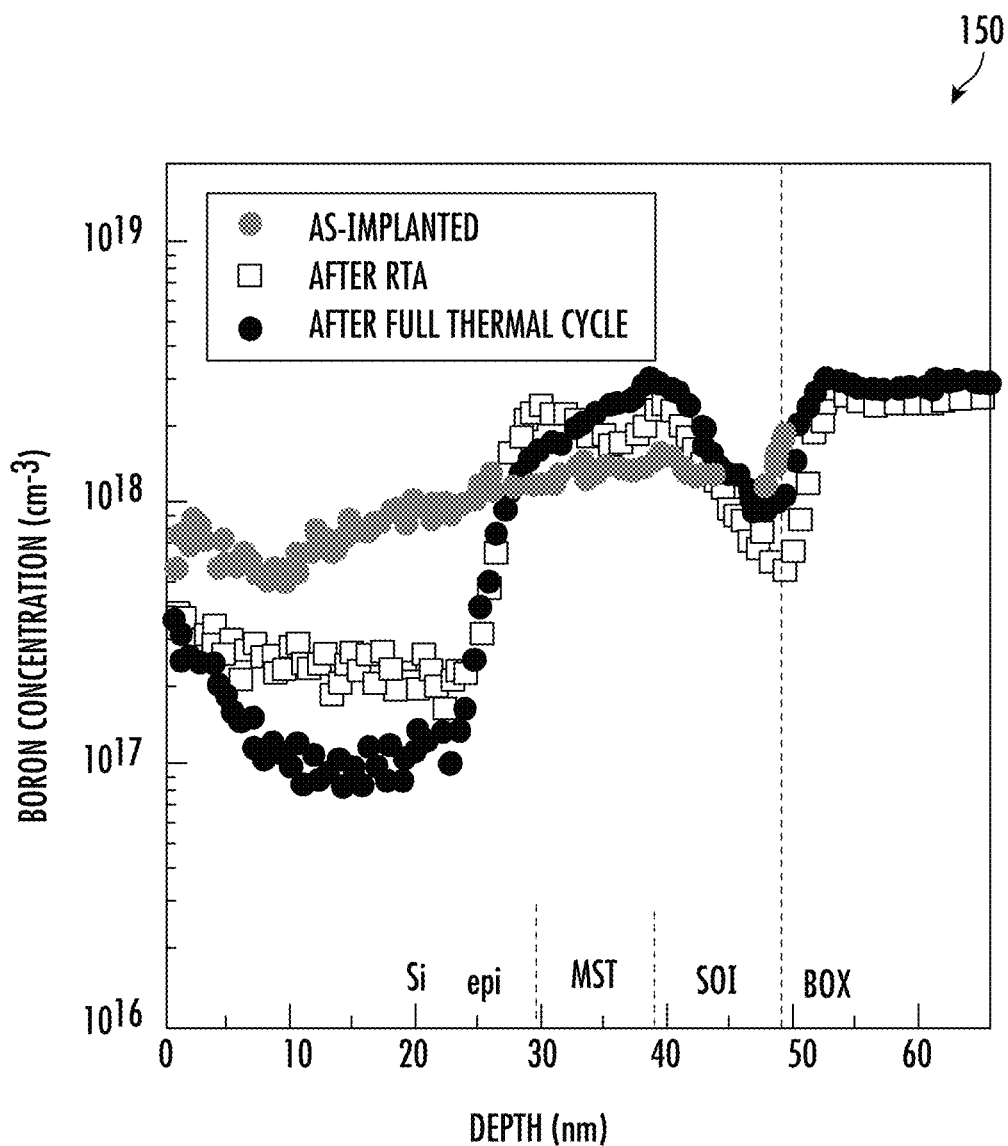

Moreover, SIMS was also used to confirm the viability of ground plane and Vt implant doping after MST film deposition, and the results are shown in the graphs 140, 150 of FIGS. 14 and 15. In particular, the graph 140 corresponds to a silicon epi control performed on an SOI layer, while the graph 150 corresponds to an MST film on an SOI layer. Here again, the SOI layer was thinned to 12 nm, and a boron implantation of 24 keV at 2.0E13 was performed for the ground plane implant. Furthermore, a rapid thermal anneal (RTA) was performed at 950° C. for 5 s, followed by a full thermal cycle (well RTA+gate oxide (GOX)+poly reox+ LDD RTA+source/drain (SD) RTA). In the control epi silicon, boron is lost after a light RTA, and then further reduced after full thermal cycle for CMOS. However, with the MST film present, the structure provides enhanced boron retention at the BOX interface after the initial RTA and subsequent full thermal cycle, as shown.

More particularly, the MST film advantageously provides for the retention of a relatively high dopant concentration in the ground plane layer which, in turn, provides faster RF device switching, lower on resistance and desired breakdown performance. The above-described processes also permit adjustment of the Vt of the other RF devices having a lower dopant concentration than the RF switching devices, as will be appreciated by those skilled in the art.

Further details regarding the dopant retention capabilities of MST films may be found in U.S. Pat. No. 9,899,479 to Mears et al. and U.S. Pat. No. 10,580,866 to Takeuchi et al., both of which are assigned to the present Applicant and are hereby incorporated herein in their entireties by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included.

The invention claimed is:

1. A semiconductor integrated circuit (IC) comprising:
a semiconductor-on-insulator substrate comprising an insulator layer and a doped semiconductor layer thereon, the doped semiconductor layer having a first region and a second region adjacent thereto;
a superlattice over the first and second adjacent regions of the semiconductor layer, the superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions;
the first region of the semiconductor layer comprising a first dopant concentration to serve as a Radio Frequency (RF) ground plane layer for a first semiconductor RF device; and
the second region of the semiconductor layer comprising a second dopant concentration for a threshold voltage adjustment of a second semiconductor device;
wherein the doped semiconductor layer of the semiconductor-on-insulator substrate has a thickness of 35 nm or less.

2. The semiconductor IC of claim 1 comprising:
respective first and second body regions above the superlattice;
respective source and drain regions associated with the first and second body regions; and
respective first and second gates associated with the first and second body regions.

3. The semiconductor IC of claim 2 comprising a first body contact coupled to the first body region.

4. The semiconductor IC of claim 1 wherein the first semiconductor RF device comprises an RF switch.

5. The semiconductor IC of claim 1 wherein the RF ground plane layer has a thickness in a range of 10-50 nm.

6. The semiconductor IC of claim 1 wherein the base semiconductor portions have a dopant concentration of at least $5\times10^{17}$ cm$^{-3}$.

7. The semiconductor IC of claim 1 wherein the base semiconductor monolayers comprise silicon.

8. The semiconductor IC of claim 1 wherein the non-semiconductor monolayers comprise oxygen.

9. The semiconductor IC of claim 1 wherein the semiconductor-on-insulator substrate comprises a silicon-on-insulator (SOI) substrate.

10. A semiconductor integrated circuit (IC) comprising:
a semiconductor-on-insulator substrate comprising an insulator layer and a doped semiconductor layer thereon, the doped semiconductor layer having a first region and a second region adjacent thereto;
a superlattice over the first and second adjacent regions of the semiconductor layer, the superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions;
the first region of the semiconductor layer and adjacent portions of the superlattice comprising a first dopant concentration to serve as a Radio Frequency (RF) ground plane layer for a first semiconductor RF device; and
the second region of the semiconductor layer and adjacent portions of the superlattice comprising a second dopant concentration for a threshold voltage adjustment of a second semiconductor device;
wherein the doped semiconductor layer of the semiconductor-on-insulator substrate has a thickness of 35 nm or less.

11. The semiconductor IC of claim 10 comprising:
respective first and second body regions above the superlattice;
respective source and drain regions associated with the first and second body regions; and
respective first and second gates associated with the first and second body regions.

12. The semiconductor IC of claim 11 comprising a first body contact coupled to the first body region.

13. The semiconductor IC of claim 10 wherein the first semiconductor RF device comprises an RF switch.

14. The semiconductor IC of claim 10 wherein the RF ground plane layer has a thickness in a range of 10-50 nm.

15. The semiconductor IC of claim 10 wherein the base semiconductor portions have a dopant concentration of at least $5\times10^{17}$ cm$^{-3}$.

16. The semiconductor IC of claim 10 wherein the base semiconductor monolayers comprise silicon.

17. The semiconductor IC of claim 10 wherein the non-semiconductor monolayers comprise oxygen.

18. The semiconductor IC of claim 10 wherein the semiconductor-on-insulator substrate comprises a silicon-on-insulator (SOI) substrate.

19. A semiconductor integrated circuit (IC) comprising:
a silicon-on-insulator substrate comprising an insulator layer and a doped silicon layer thereon, the doped silicon layer having a first region and a second region adjacent thereto;
a superlattice over the first and second adjacent regions of the semiconductor layer, the superlattice comprising a plurality of stacked groups of layers, each group of layers comprising a plurality of stacked base silicon monolayers defining a base silicon portion, and at least one oxygen monolayer constrained within a crystal lattice of adjacent base silicon portions;
the first region of the silicon layer comprising a first dopant concentration to serve as a Radio Frequency (RF) ground plane layer for a first semiconductor RF device; and
the second region of the silicon layer comprising a second dopant concentration for a threshold voltage adjustment of a second semiconductor device;
wherein the doped semiconductor layer of the semiconductor-on-insulator substrate has a thickness of 35 nm or less.

20. The semiconductor IC of claim 19 comprising:
respective first and second body regions above the superlattice;
respective source and drain regions associated with the first and second body regions; and
respective first and second gates associated with the first and second body regions.

21. The semiconductor IC of claim 19 wherein the first semiconductor RF device comprises an RF switch.

22. The semiconductor IC of claim 19 wherein the RF ground plane layer has a thickness in a range of 10-50 nm.

23. The semiconductor IC of claim 19 wherein the base semiconductor portions have a dopant concentration of at least $5 \times 10^{17}$ cm$^{-3}$.

* * * * *

UNITED STATES PATENT AND TRADEMARK OFFICE
CERTIFICATE OF CORRECTION

Page 1 of 2

PATENT NO. : 12,417,912 B2
APPLICATION NO. : 18/669156
DATED : September 16, 2025
INVENTOR(S) : Takeuchi et al.

It is certified that error appears in the above-identified patent and that said Letters Patent is hereby corrected as shown below:

On the Title Page

Item (56), Other Publications

Delete: "U.S. Appl. No. 17/653,305, filed Apr. 21, 2021, Hytha et al. See Priority U.S. Appl. No. 17/653,305, filed Mar. 3, 2022."

Insert: --U.S. Appl. No. 17/236,289, filed Apr. 21, 2021, Hytha et al. See Priority U.S. Appl. No. 17/653,305, filed Mar. 3, 2022.--

Page 3, Item (56), Other Publications

Delete: "U.S. Appl. No. 17/653,305, filed May 26, 2021, Hytha et al. See Priority U.S. Appl. No. 17/653,305, filed Mar. 3, 2022.
U.S. Appl. No. 17/653,305, filed Oct. 28, 2021, Hytha et al. See Priority U.S. Appl. No. 17/653,305, filed Mar. 3, 2022.
U.S. Appl. No. 17/653,305, filed Mar. 3, 2022, Takeuchi et al. See Priority U.S. Appl. No. 17/653,305, filed Mar. 3, 2022."

Insert: --U.S. Appl. No. 17/236,329, filed Apr. 21, 2021, Hytha et al. See Priority U.S. Appl. No. 17/653,305, filed Mar. 3, 2022.
U.S. Appl. No. 17/330,831, filed May 26, 2021, Hytha et al. See Priority U.S. Appl. No. 17/653,305, filed Mar. 3, 2022.
U.S. Appl. No. 17/330,860, filed May 26, 2021, Hytha et al. See Priority U.S. Appl. No. 17/653,305, filed Mar. 3, 2022.
U.S. Appl. No. 17/452,604, filed Oct. 28, 2021, Hytha et Signed and Sealed this
Fourteenth Day of October, 2025

John A. Squires
*Director of the United States Patent and Trademark Office* al. See Priority U.S. Appl. No. 17/653,305, filed Mar. 3, 2022.
U.S. Appl. No. 17/452,610, filed Oct. 28, 2021, Hytha et al. See Priority U.S. Appl. No. 17/653,305, filed Mar. 3, 2022.
U.S. Appl. No. 17/653,319, filed Mar 3, 2022, Takeuchi et al. See Priority U.S. Appl. No. 17/653,305, filed Mar. 3, 2022.--